US012772870B2

(12) United States Patent
Kimura et al.

(10) Patent No.: US 12,772,870 B2
(45) Date of Patent: Oct. 20, 2026

(54) SEMICONDUCTOR DEVICE

(71) Applicant: ROHM CO., LTD., Kyoto (JP)

(72) Inventors: Ryuta Kimura, Kyoto (JP); Yosui Futamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 946 days.

(21) Appl. No.: 17/682,965

(22) Filed: Feb. 28, 2022

(65) Prior Publication Data

US 2022/0301993 A1 Sep. 22, 2022

(30) Foreign Application Priority Data

Mar. 17, 2021 (JP) ................................ 2021-043544

(51) Int. Cl.

*H10W 70/40* (2026.01)
*H10W 74/00* (2026.01)
*H10W 90/00* (2026.01)

(52) U.S. Cl.

CPC ....... *H10W 70/481* (2026.01); *H10W 70/417* (2026.01); *H10W 70/457* (2026.01);
(Continued)

(58) Field of Classification Search

CPC ......... H01L 23/49562; H01L 23/49513; H01L 23/49568; H01L 24/48; H01L 2224/4814; H01L 2224/48245; H01L 2924/13055; H01L 2924/13064; H01L 2924/13091; H01L 2924/182; H01L 24/29; H01L 24/32; H01L 24/49; H01L 24/73; H01L 24/83; H01L 24/85; H01L 2224/29339;
(Continued)

(56) References Cited

U.S. PATENT DOCUMENTS 7,449,774 B1 * 11/2008 Jeun .................... H10W 40/778
257/676
8,022,522 B1 9/2011 Liou et al.
(Continued)

FOREIGN PATENT DOCUMENTS

JP 2004047955 A 2/2004
JP 2005109100 A 4/2005
(Continued)

OTHER PUBLICATIONS

Notice of Reasons for Refusal issued in Japanese Application No. 2021-043544, dated Nov. 12, 2024, with English translation.
(Continued)

*Primary Examiner* — Raj R Gupta
(74) *Attorney, Agent, or Firm* — HSML P.C.

(57) ABSTRACT

A semiconductor device includes: a first lead; a first semiconductor element mounted on the first lead; and a sealing resin that covers the first semiconductor element, wherein the first lead includes: a first die pad having a first main surface and a first back surface facing opposite sides to each other in a thickness direction; a second die pad arranged side by side with the first die pad in a first direction orthogonal to the thickness direction, and located on a side of the first main surface with respect to the first die pad in the thickness direction; and a connecting portion connected to the first die pad and the second die pad, and wherein the first back surface is exposed from the sealing resin.

14 Claims, 22 Drawing Sheets

(52) U.S. Cl.
CPC ......... *H10W 70/461* (2026.01); *H10W 90/00* (2026.01); *H10W 90/811* (2026.01); *H10W 74/00* (2026.01); *H10W 90/753* (2026.01); *H10W 90/756* (2026.01)

(58) Field of Classification Search
CPC ......... H01L 2224/8384; H01L 23/4334; H01L 2224/04042; H01L 2224/29101; H01L 23/49503; H01L 24/45; H01L 2224/32245; H01L 2224/45014; H01L 2224/45124; H01L 2224/45139; H01L 2224/45144; H01L 2224/45147; H01L 2224/48091; H01L 2224/48137; H01L 2224/48247; H01L 2224/48465; H01L 2224/48471; H01L 2224/49175; H01L 2224/73265; H01L 2224/83801; H01L 2224/85439; H01L 2924/181; H01L 23/4951; H01L 23/49551; H01L 25/072; H01L 23/49582; H01L 23/49575; H10W 90/753; H10W 90/811
See application file for complete search history.

(56) References Cited

U.S. PATENT DOCUMENTS

2017/0301643 A1* 10/2017 Danno .................. H10W 40/22
2018/0040540 A1* 2/2018 Kasuya ..................... H02P 6/12

FOREIGN PATENT DOCUMENTS

JP 2007266218 A 10/2007
JP 2007317781 A 12/2007
JP 2012059885 A 3/2012
JP 2017026463 A 2/2017
JP 2018022849 A 2/2018

OTHER PUBLICATIONS

Office Action issued in Japanese Application No. 2021043544, dated Sep. 30, 2025, with English translation.
Office Action issued in Japanese Patent Application No. 2021-043544, mailed Apr. 15, 2025, with English translation.

* cited by examiner

SEMICONDUCTOR DEVICE

CROSS-REFERENCE TO RELATED APPLICATION

This application is based upon and claims the benefit of priority from Japanese Patent Application No. 2021-043544, filed on Mar. 17, 2021, the entire contents of which are incorporated herein by reference.

TECHNICAL FIELD

The present disclosure relates to a semiconductor device.

BACKGROUND

As one of various electronic devices, there is a semiconductor device using a lead frame. Semiconductor devices include multi-chip devices in which a plurality of semiconductor elements is mounted side by side on the same lead. An example of a semiconductor device, which is a conventional multi-chip device, includes a plurality of semiconductor chips, a lead frame, and a resin. The plurality of semiconductor chips is mounted side by side on an island of the lead frame. Each pad of the semiconductor chips and each lead terminal of the lead frame are electrically connected by wires. The plurality of semiconductor chips is sealed with the resin. In this semiconductor device, since the plurality of semiconductor chips is mounted side by side on the same island, there is a possibility that the semiconductor device is manufactured in a state where the semiconductor chips are in contact with one another. Further, without being limited to the semiconductor chips, even when a plurality of electronic components (including the semiconductor chips) are mounted side by side on the same lead, there is a possibility that the electronic components come into contact with one another.

SUMMARY

Some embodiments of the present disclosure provide a semiconductor device capable of preventing electronic components mounted side by side on the same lead from being in contact with one another.

According to one embodiment of the present disclosure, there is provided a semiconductor device including: a first lead; a first semiconductor element mounted on the first lead; and a sealing resin that covers the first semiconductor element, wherein the first lead includes: a first die pad having a first main surface and a first back surface facing opposite sides to each other in a thickness direction; a second die pad arranged side by side with the first die pad in a first direction orthogonal to the thickness direction, and located on a side of the first main surface with respect to the first die pad in the thickness direction; and a connecting portion connected to the first die pad and the second die pad, and wherein the first back surface is exposed from the sealing resin.

Other features and advantages of the present disclosure will become more apparent with the detailed description given below with reference to the accompanying drawings.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
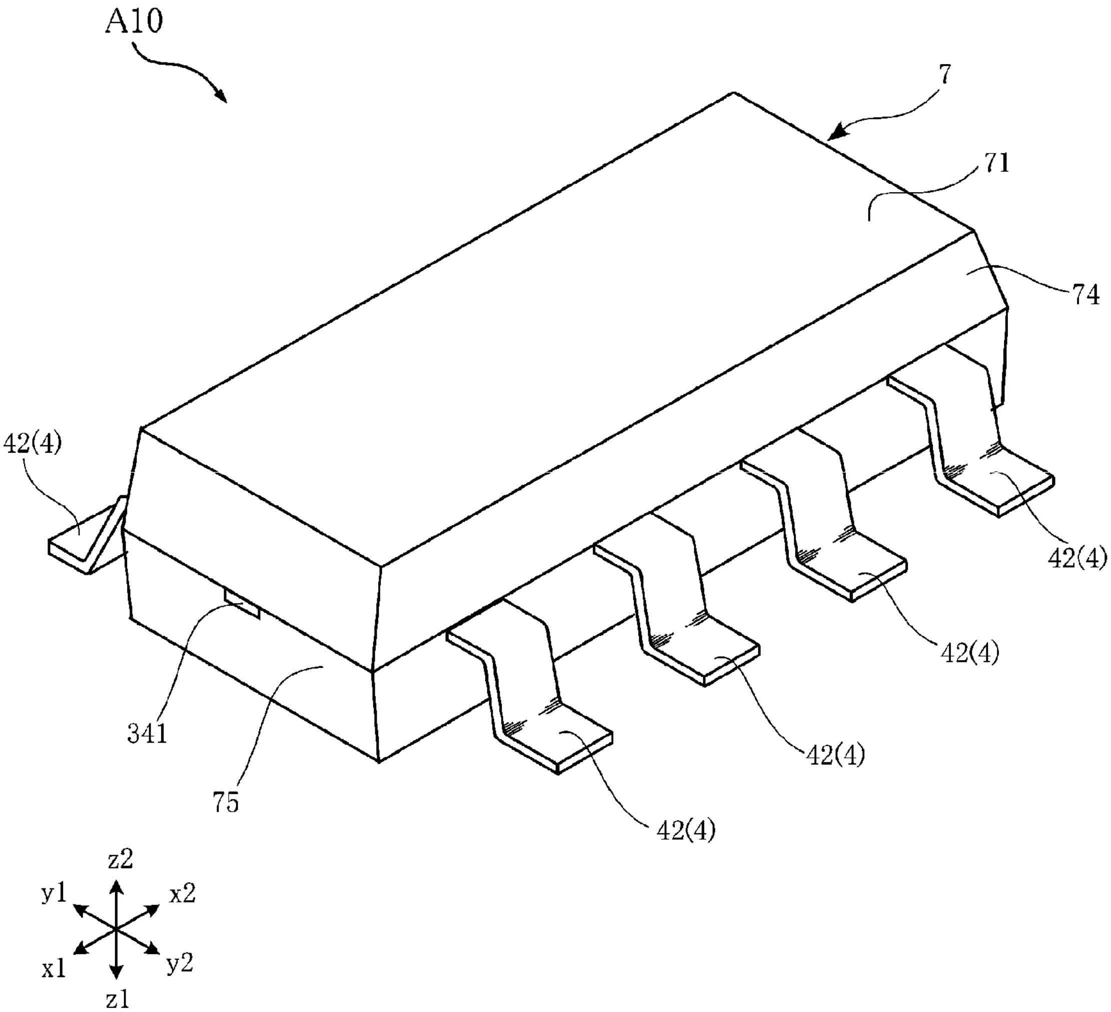
FIG. 1 is a perspective view showing a semiconductor device according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the present disclosure will be now described in detail with reference to the accompanying drawings.

In the present disclosure, the phases "a certain thing A is formed in a certain thing B" and "a certain thing A is formed on a certain thing B" include, unless otherwise specified, "a certain thing A is directly formed in a certain thing B" and "a certain thing A is formed on a certain thing B with another thing interposed between the certain thing A and the certain thing B." Similarly, the phases "a certain thing A is placed in a certain thing B" and "a certain thing A is placed on a certain thing B" include, unless otherwise specified, "a certain thing A is directly placed in a certain thing B" and "a certain thing A is placed in a certain thing B with another thing interposed between the certain thing A and the certain thing B." Similarly, the phase "a certain thing A is located on a certain thing B" includes, unless otherwise specified, "a certain thing A is located on a certain thing B and is in contact with the certain thing B" and "a certain thing A is located on a certain thing B with another thing interposed between the certain thing A and the certain thing B." In addition, the phase "a certain thing A overlaps with another certain thing B when viewed in a certain direction" includes, unless otherwise specified, "a certain thing A overlaps entirely with a certain thing B" and "a certain thing A overlaps partially with a certain thing B."

First Embodiment

FIGS. 1 to 9 show an example of a semiconductor device according to a first embodiment of the present disclosure. A semiconductor device A10 of the present embodiment includes a first semiconductor element 11, a second semiconductor element 12, a conductive support member 2, wires 61, 62, and 63, metal layers 65 and 66, bonding layers 68 and 69, and a sealing resin 7. The conductive support member 2 includes a first lead 3 and a plurality of second leads 4. The application and function of the semiconductor device A10 are not particularly limited. In the present embodiment, the package format of the semiconductor device A10 is SOP (Small Outline Package). However, the package format of the semiconductor device A10 is not limited to SOP.

Figure 2:
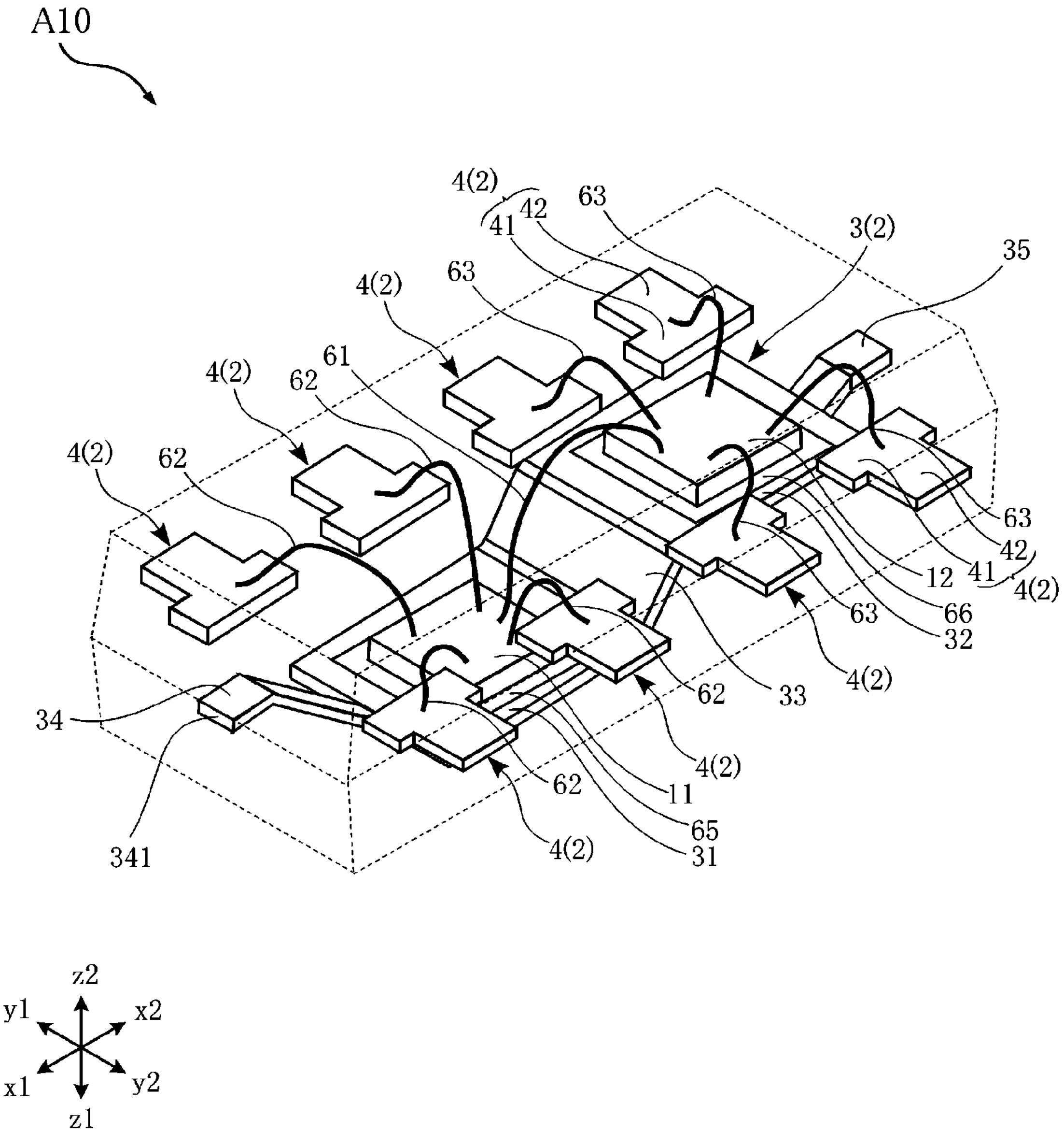
FIG. 2 is a perspective view showing the semiconductor device of FIG. 1, wherein a sealing resin is transparent and a portion of each second lead is omitted.
Figure 3:
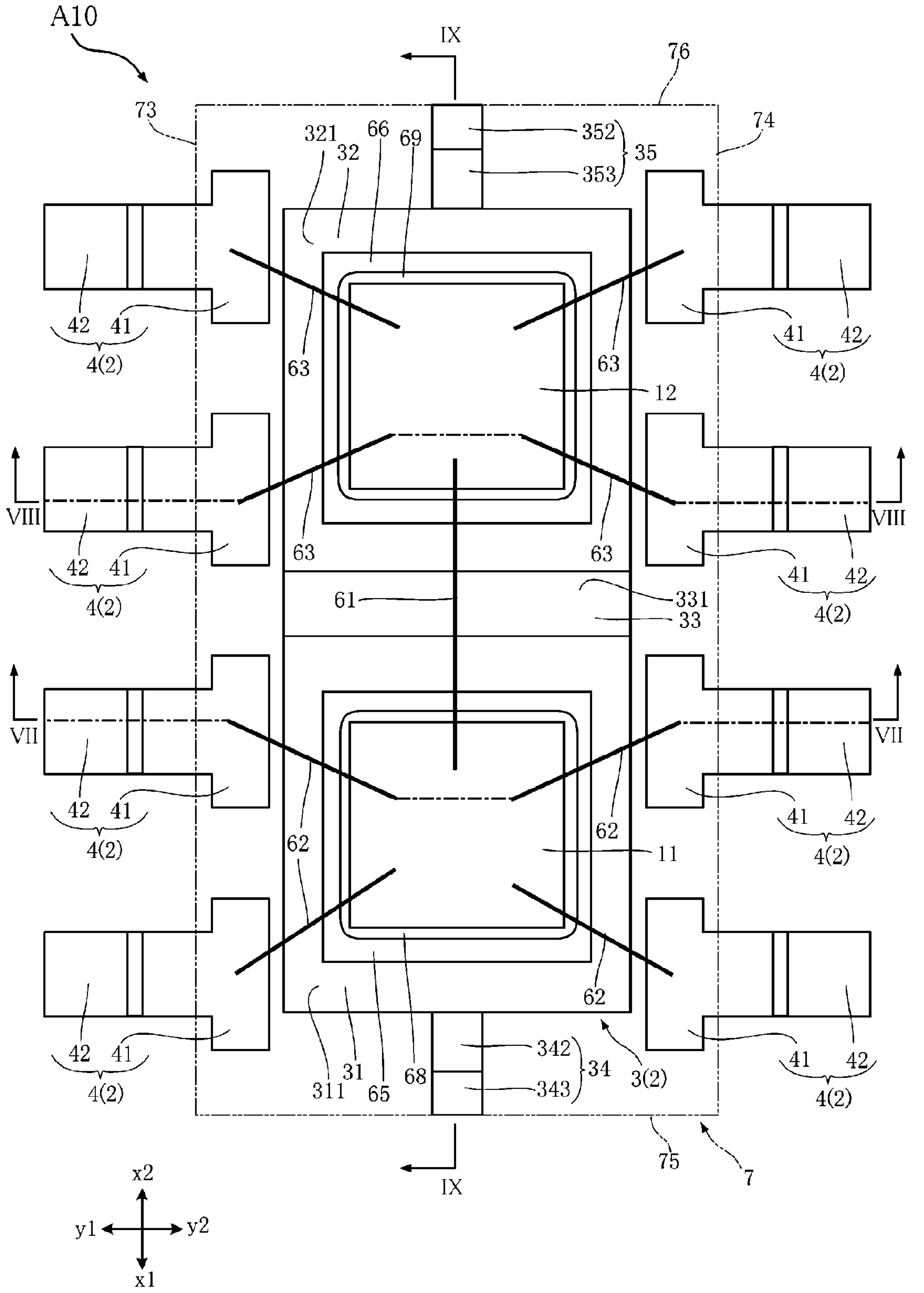
FIG. 3 is a plan view showing the semiconductor device of FIG. 1, wherein the sealing resin is transparent.
Figure 4:
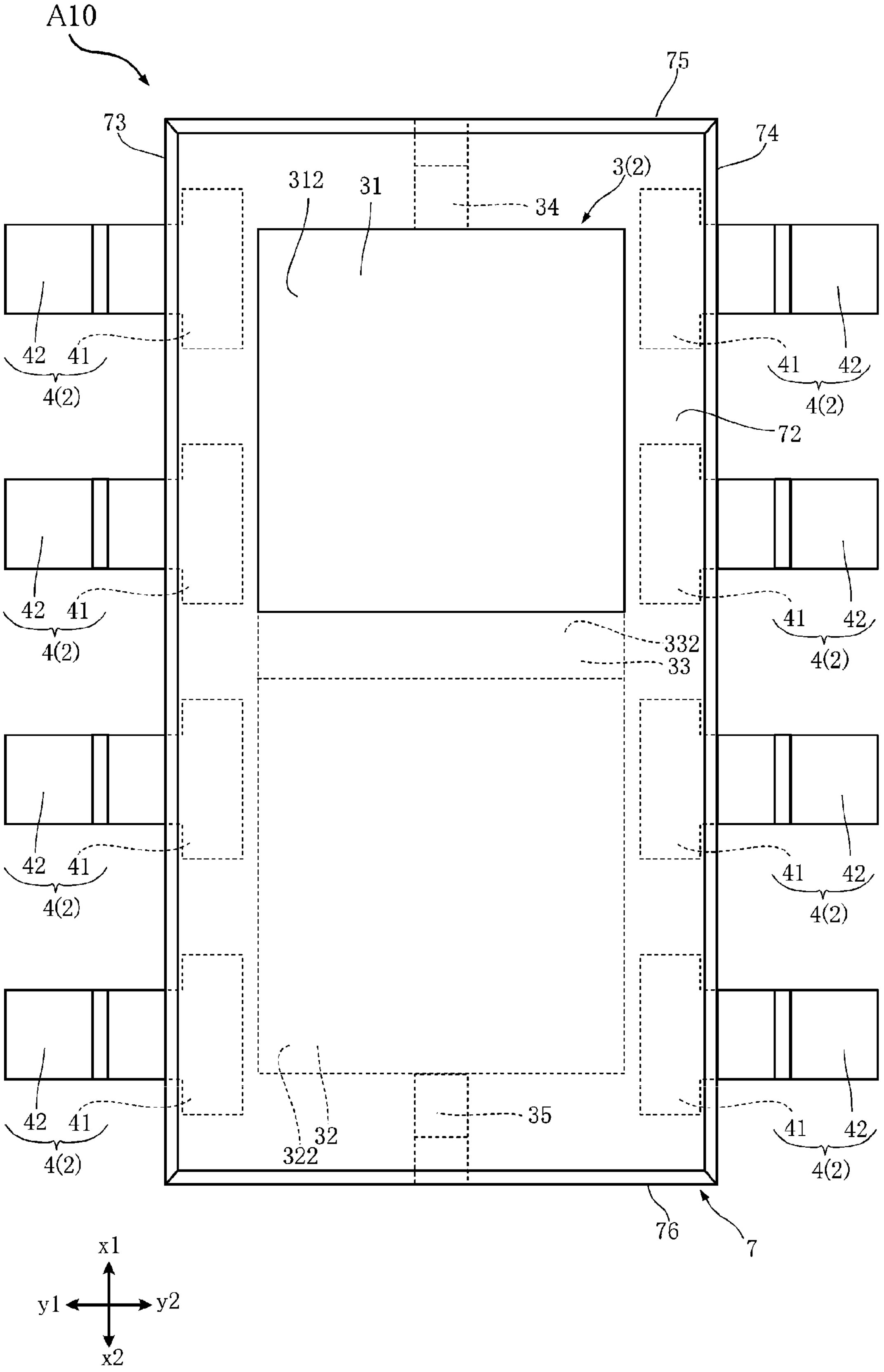
FIG. 4 is a bottom view showing the semiconductor device of FIG. 1.
Figure 5:
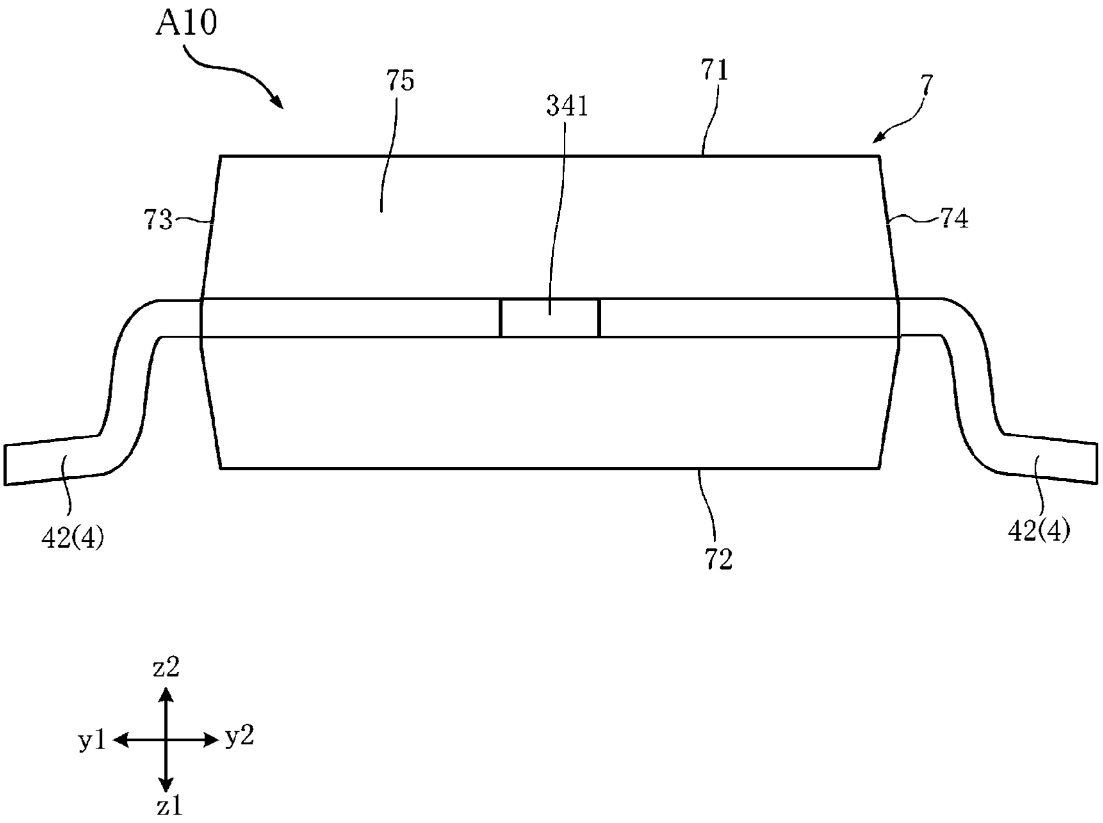
FIG. 5 is a front view showing the semiconductor device of FIG. 1.
Figure 6:
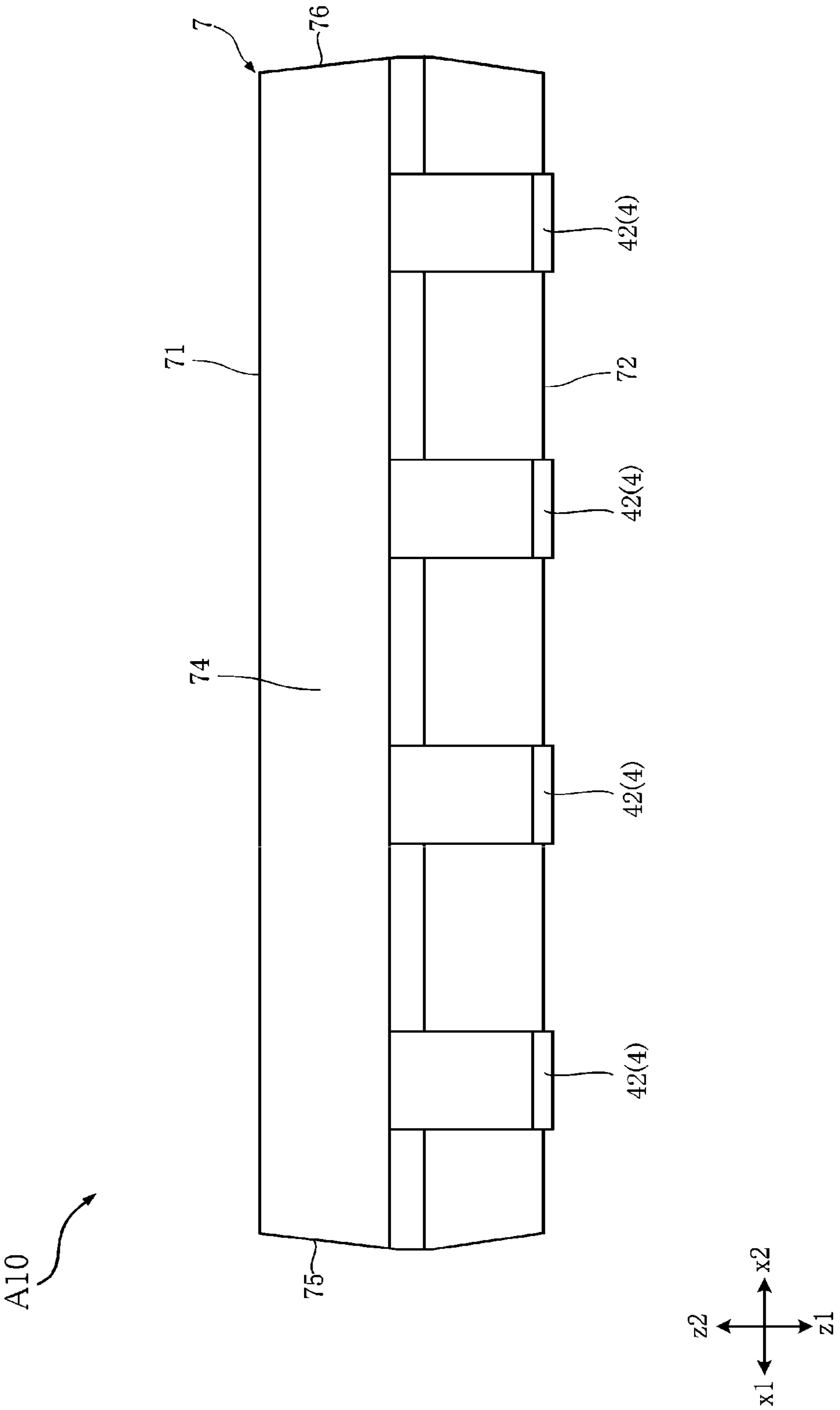
FIG. 6 is a right-hand side view showing the semiconductor device of FIG. 1.
Figure 7:
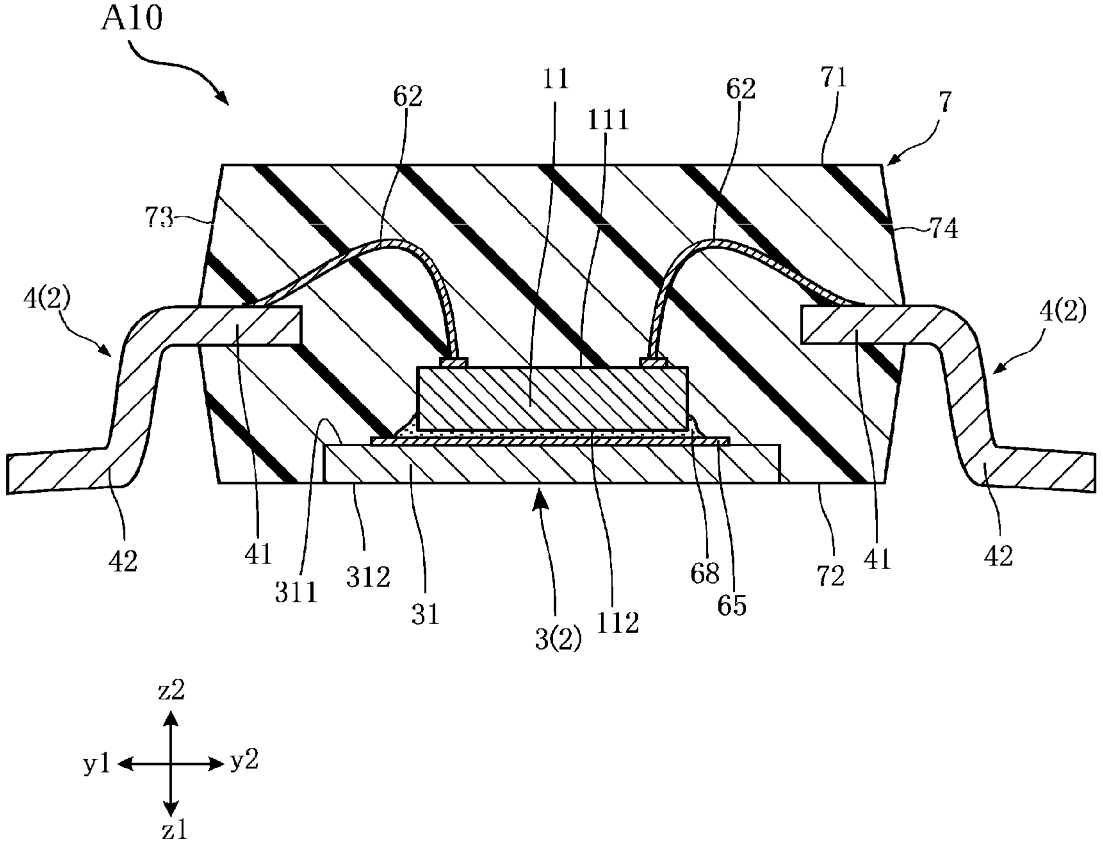
FIG. 7 is a cross-sectional view taken along line VII-VII in FIG. 3.
Figure 8:
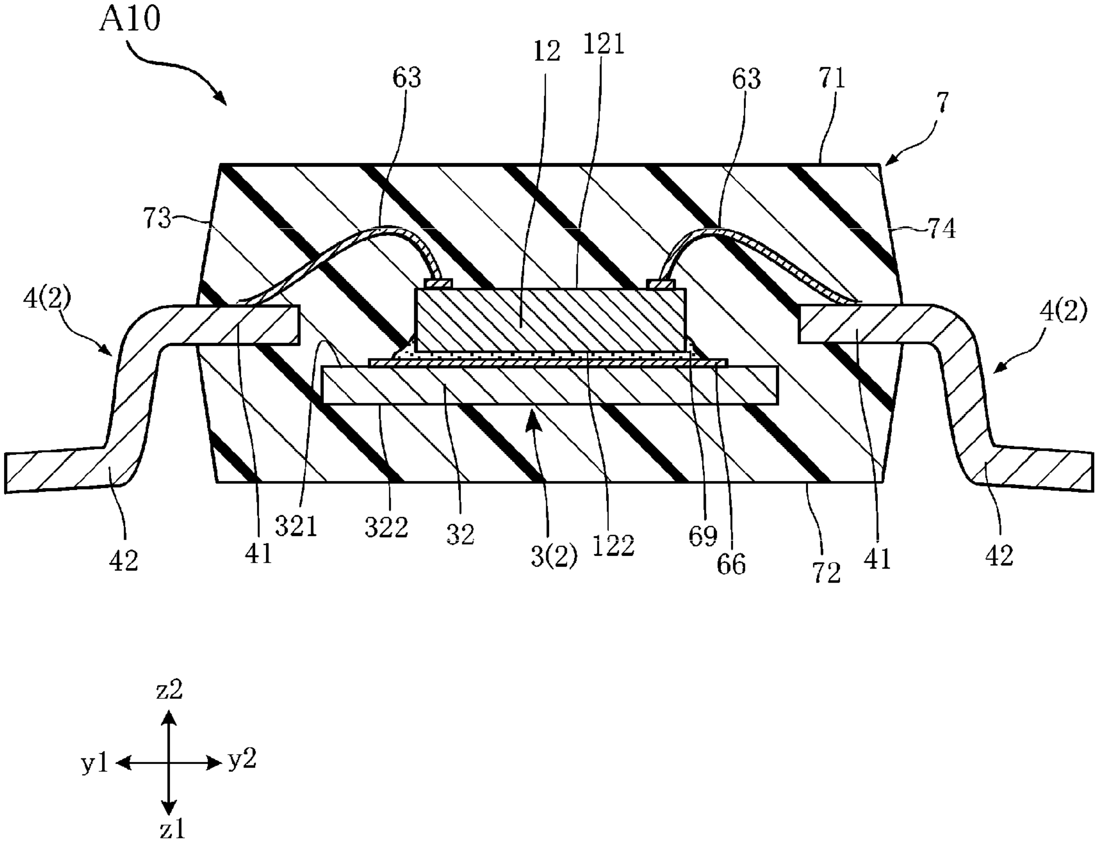
FIG. 8 is a cross-sectional view taken along line VIII-VIII in FIG. 3.
Figure 9:
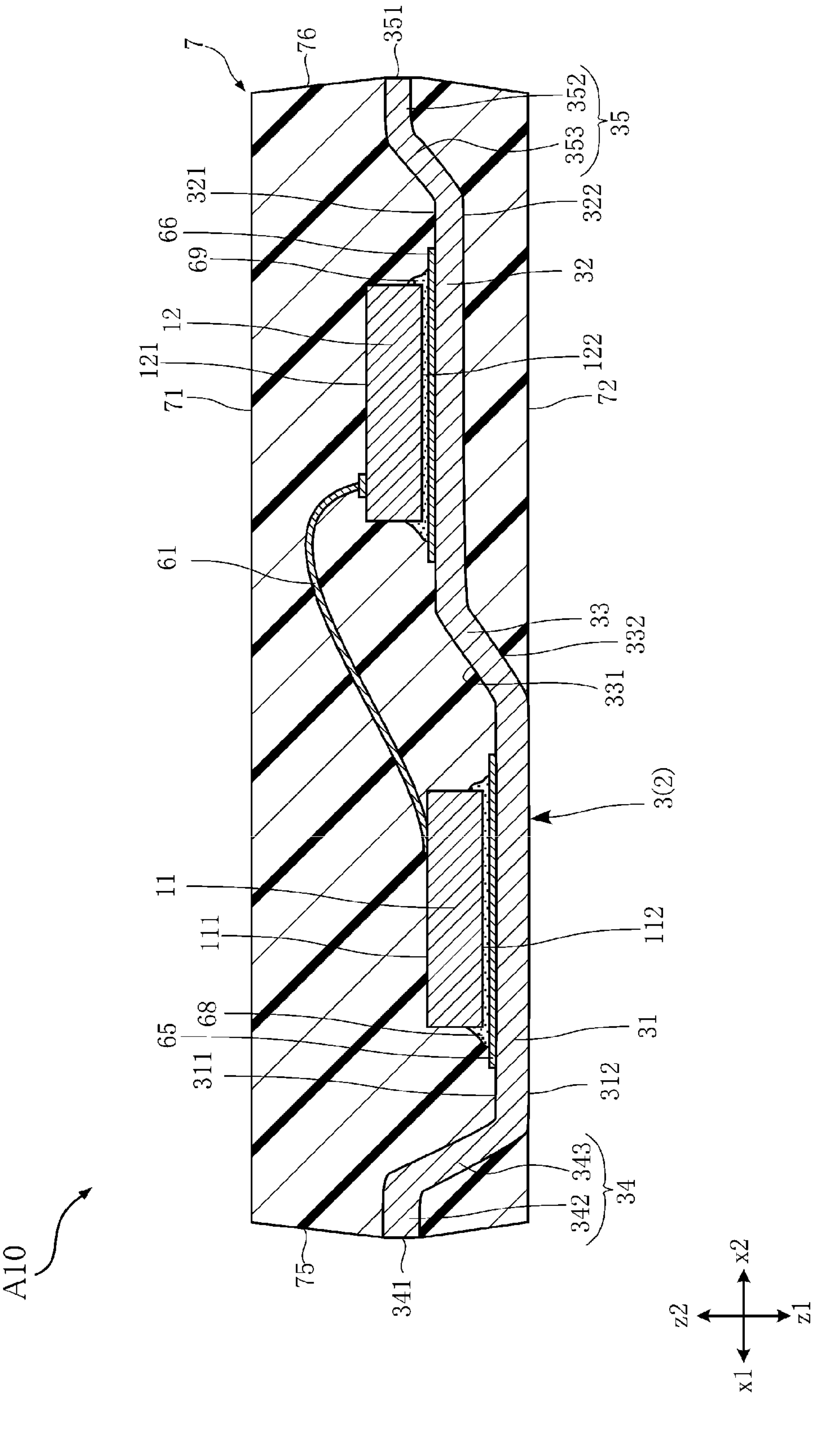
FIG. 9 is a cross-sectional view taken along line IX-IX in FIG. 3.

FIG. 1 is a perspective view showing the semiconductor device A10. FIG. 2 is a perspective view showing the semiconductor device A10. For the sake of convenience of understanding, in FIG. 2, the sealing resin 7 is transparent and the outer shape of the sealing resin 7 is indicated by an imaginary line (a two-dot chain line). Further, in FIG. 2, for the sake of convenience of understanding, a portion of each of the second leads 4 is omitted. FIG. 3 is a plan view showing the semiconductor device A10. For the sake of convenience of understanding, in FIG. 3, the sealing resin 7 is transparent and the outer shape of the sealing resin 7 is indicated by an imaginary line (a two-dot chain line). FIG. 4 is a bottom view showing the semiconductor device A10. FIG. 5 is a front view showing the semiconductor device A10. FIG. 6 is a right-hand side view showing the semiconductor device A10. FIG. 7 is a cross-sectional view taken along line VII-VII in FIG. 3. FIG. 8 is a cross-sectional view taken along line VIII-VIII in FIG. 3. FIG. 9 is a cross-sectional view taken along line IX-IX in FIG. 3.

The semiconductor device A10 has a rectangular shape in a thickness direction thereof (in plan view). For the sake of convenience of explanation, the thickness direction (plan view direction) of the semiconductor device A10 is defined as a z direction, a direction (vertical direction in FIGS. 3 and 4) along the long side of the semiconductor device A10 orthogonal to the z direction is defined as an x direction, and a direction (horizontal direction in FIGS. 3 and 4) orthogonal to the z direction and the x direction is defined as a y direction. Further, one side (lower side in FIGS. 5 to 6) in the z direction is defined as a z1 side, and the other side (upper side in FIGS. 5 to 6) is defined as a z2 side. One side (lower side in FIG. 3) in the x direction is defined as an x1 side, and the other side (upper side in FIG. 3) is defined as an x2 side. One side (left-hand side in FIGS. 3 and 4) in they direction is defined as a y1 side, and the other side (right-hand side in FIGS. 3 and 4) is defined as a y2 side. The z direction corresponds to a "thickness direction" of the present disclosure, and the x direction corresponds to a "first direction" of the present disclosure. The shape and dimensions of the semiconductor device A10 are not particularly limited.

In the semiconductor device A10, the conductive support member 2 is a member that constitutes a conduction path between the first semiconductor element 11 and a wiring board on which the semiconductor device A10 is mounted, and a conduction path between the second semiconductor element 12 and the wiring board. The conductive support member 2 is made of, for example, an alloy containing Cu in its composition. The material of the conductive support member 2 is not particularly limited, and may be Cu, Ni, or an alloy containing Cu or Ni in its composition. The conductive support member 2 is formed from a lead frame to be described later. The conductive support member 2 mounts thereon the first semiconductor element 11 and the second semiconductor element 12. As shown in FIG. 3, the conductive support member 2 includes the first lead 3 and the plurality of second leads 4.

The first lead 3 is arranged at the center of the semiconductor device A10 in the y direction. Further, the first lead 3 extends over the entire semiconductor device A10 in the x direction. The first semiconductor element 11 and the second semiconductor element 12 are mounted on the first lead 3. The first lead 3 includes a first die pad 31, a second die pad 32, a connecting portion 33, and fixing portions 34 and 35.

The first die pad 31 is arranged in the first lead 3 closer to the x1 side in the x direction than the center in the x direction. The first die pad 31 has a rectangular shape when viewed in the z direction. The first die pad 31 includes a main surface 311 and a back surface 312. The main surface 311 and the back surface 312 are separated in the z direction as shown in FIGS. 7 and 9. The main surface 311 faces the z2 side, and the back surface 312 faces the z1 side. Each of the main surface 311 and the back surface 312 is substantially flat. The first semiconductor element 11 is mounted on the main surface 311. The back surface 312 is exposed from the sealing resin 7 to form a back surface terminal, and is bonded to the wiring board on which the semiconductor device A10 is mounted.

As shown in FIG. 3, the metal layer 65 is arranged on the main surface 311. The metal layer 65 covers a portion on which the first semiconductor element 11 is mounted. In the present embodiment, the metal layer 65 has a rectangular shape in the z direction and is located at the center of the main surface 311. The metal layer 65 is contained in the main surface 311 when viewed in the z direction. That is, the metal layer 65 does not extend to each end edge of the main surface 311. The metal layer 65 is formed, for example, by a plating process. The metal layer 65 contains, for example, Ag. The metal layer 65 may be made of a material having better solder wettability than the material of the first die pad 31. As the material of the metal layer 65, for example, Ni can be considered in addition to Ag. In the present embodiment, since the material of the first die pad 31 is an alloy of Cu, the metal layer 65 may be Cu which has better solder wettability than the Cu alloy. Further, the metal layer 65 is not limited to one composed of a single layer, but may be one in which a plurality of metal layers are stacked. For example, in the metal layer 65, Ni, Pd, and Au may be stacked in this order.

The second die pad 32 is arranged in the first lead 3 closer to the x2 side in the x direction than the center in the x direction. The second die pad 32 is arranged side by side with the first die pad 31 in the x direction. Further, the second die pad 32 is arranged at a position different from that of the first die pad 31 in the z direction. Specifically, the second die pad 32 is arranged on a side of the main surface 311 (the z2 side in the z direction) with respect to the first die pad 31 in the z direction. The second die pad 32 has a rectangular shape when viewed in the z direction. The second die pad 32 includes a main surface 321 and a back surface 322. The main surface 321 and the back surface 322 are separated from each other in the z direction as shown in FIGS. 8 and 9. The main surface 321 faces the z2 side, and the back surface 322 faces the z1 side. Each of the main surface 321 and the back surface 322 is substantially flat. The second semiconductor element 12 is mounted on the main surface 321. The back surface 322 is not exposed from the sealing resin 7. The second die pad 32 is entirely covered with the sealing resin 7. In the present embodiment, when viewed in the z direction, the first die pad 31 and the second die pad 32 have substantially the same size, and the area of the main surface 311 is substantially equal to the area of the main surface 321.

As shown in FIG. 3, the metal layer 66 is arranged on the main surface 321. The metal layer 66 covers a portion on which the second semiconductor element 12 is mounted. In the present embodiment, the metal layer 66 has a rectangular shape when viewed in the z direction and is located at the center of the main surface 321. The metal layer 66 is contained in the main surface 321 when viewed in the z direction. That is, the metal layer 66 does not extend to each end edge of the main surface 321. The metal layer 66 is formed, for example, by a plating process. The material of the metal layer 66 is the same as that of the metal layer 65.

The connecting portion 33 is arranged between the first die pad 31 and the second die pad 32 in the x direction, and is connected to the first die pad 31 and the second die pad 32. The connecting portion 33 is inclined with respect to the first die pad 31 and the second die pad 32. The connecting portion 33 has a rectangular shape when viewed in the z direction. The connecting portion 33 includes a main surface 331 and a back surface 332. The main surface 331 and the back surface 332 face opposite sides to each other as shown in FIG. 9. Each of the main surface 331 and the back surface 332 is substantially flat. The main surface 331 is connected to the main surface 311 of the first die pad 31 and the main surface 321 of the second die pad 32. The back surface 332 is connected to the back surface 312 of the first die pad 31 and the back surface 322 of the second die pad 32. The connecting portion 33 is entirely covered with the sealing resin 7. The first die pad 31, the second die pad 32, and the connecting portion 33 have a rectangular shape as a whole when viewed in the z direction, and are formed by processing a rectangular portion of the lead frame.

The fixing portions 34 and 35 are portions for fixing the first lead 3 to the lead frame. As shown in FIG. 3, the fixing portion 34 has a rectangular shape when viewed in the z direction, and extends in the x direction. The end portion of the fixing portion 34 on the x2 side in the x direction is connected to the end portion of the first die pad 31 on the x1 side in the x direction. The end portion of the fixing portion 34 on the x1 side in the x direction is exposed from the sealing resin 7. The fixing portion 34 includes an end surface 341 as shown in FIGS. 1, 2, 5, and 9. The end surface 341 is a surface facing the x1 side in the x direction and is a surface exposed from the sealing resin 7. The end surface 341 is a surface formed when the first lead 3 is separated from the lead frame by dicing in a manufacturing process. Further, in the present embodiment, the fixing portion 34 includes a parallel portion 342 and an inclined portion 343 as shown in FIG. 9. The parallel portion 342 has the end surface 341 and extends in parallel to the first die pad 31. The parallel portion 342 is arranged on the z2 side in the z direction with respect to the first die pad 31. The inclined portion 343 is connected to the parallel portion 342 and the first die pad 31, and extends to be inclined with respect to the parallel portion 342 and the first die pad 31.

As shown in FIG. 3, the fixing portion 35 has a rectangular shape when viewed in the z direction, and extends in the x direction. The end portion of the fixing portion 35 on the x1 side in the x direction is connected to the end portion of the second die pad 32 on the x2 side in the x direction. The end portion of the fixing portion 35 on the x2 side in the x direction is exposed from the sealing resin 7. The fixing portion 35 includes an end surface 351 as shown in FIG. 9. The end surface 351 is a surface facing the x2 side in the x direction and is a surface exposed from the sealing resin 7. The end surface 351 is a surface formed when the first lead 3 is separated from the lead frame by dicing in a manufacturing process. Further, in the present embodiment, the fixing portion 35 includes a parallel portion 352 and an inclined portion 353 as shown in FIG. 9. The parallel portion 352 has the end surface 351 and extends in parallel to the second die pad 32. The parallel portion 352 is arranged on the z2 side in the z direction with respect to the second die pad 32. The inclined portion 353 is connected to the parallel portion 352 and the second die pad 32, and extends to be inclined with respect to the parallel portion 352 and the second die pad 33.

The plurality of second leads 4 is a member that is bonded to the wiring board on which the semiconductor device A10 is mounted to form a conduction path between the semiconductor device A10 and the wiring board. Each of the second leads 4 is appropriately conductive to the first semiconductor element 11 or the second semiconductor element 12. In the present embodiment, the semiconductor device A10 includes eight second leads 4. As shown in FIGS. 3 and 4, four second leads 4 are arranged on the y1 side in the y direction with respect to the first lead 3. The four second leads 4 are arranged at equal intervals along the x direction while being separated from one another. Further, the four second leads 4 protrude from the sealing resin 7 (a side surface 73 to be described later) to the y1 side in the y direction. Further, as shown in FIGS. 3 and 4, the other four second leads 4 are arranged on the y2 side in the y direction with respect to the first lead 3. The four second leads 4 are arranged at equal intervals along the x direction while being separated from one another. Further, the four second leads 4 protrude from the sealing resin 7 (a side surface 74 to be described later) to the y2 side in the y direction. The number of second leads 4 is not particularly limited. Further, some second leads 4 may be electrically connected to the first lead 3. Further, the conductive support member 2 may include a second lead 4 that is not electrically connected to any of the first semiconductor element 11, the second semiconductor element 12, and the first lead 3.

Each of the second leads 4 includes a pad portion 41 and a terminal portion 42. The terminal portion 42 has a rectangular shape extending along the y direction when viewed in the z direction, and includes a portion protruding from the sealing resin 7 and a portion covered with the sealing resin 7. As shown in FIGS. 7 and 8, the portion of the terminal portion 42 protruding from the sealing resin 7 is bent in a gull-wing shape. Further, the portion of the terminal portion 42 protruding from the sealing resin 7 may be plated. A plating layer formed by the plating is made of an alloy containing Sn, such as solder, and covers the portion protruding from the sealing resin 7. When the semiconductor device A10 is surface-mounted on the wiring board by solder bonding, the plating layer prevents erosion of the protruding portion due to the solder bonding while improving adhesion of the solder to the protruding portion.

The pad portion 41 is connected to the portion of the terminal portion 42 covered with the sealing resin 7. The shape of the pad portion 41 when viewed in the z direction is not particularly limited, but in the present embodiment, it is a rectangular shape elongated in the x direction. The upper surface (the surface facing the z2 side) of the pad portion 41 is substantially flat, and is bonded to the wire 62 or the wire 63. The upper surface of the pad portion 41 may be plated. A plating layer formed by the plating is made of, for example, metal containing Ag, and covers the upper surface of the pad portion 41. The plating layer protects the lead frame from an impact during wire bonding of the wires 62 and 63 while increasing the bonding strength of the wires 62 and 63. The entire pad portion 41 is covered with the sealing resin 7. As shown in FIG. 2, the pad portion 41 is located at the same position as the parallel portion 342 of the fixing portion 34 and the parallel portion 352 of the fixing portion 35 of the first lead 3 in the z direction, and is located on the z2 side in the z direction with respect to the first die pad 31 and the second die pad 32.

The first semiconductor element 11 and the second semiconductor element 12 are elements that serve as the functional center of the semiconductor device A10.

The first semiconductor element 11 is a switching element, and in the present embodiment, it is a power MOSFET (Metal-Oxide-Semiconductor Field-Effect Transistor). The first semiconductor element 11 may be another transistor such as an IGBT (Insulated Gate Bipolar Transistor) or a HEMT (High Electron Mobility Transistor), and the type and internal structure thereof are not particularly limited.

As shown in FIGS. 7 and 9, the first semiconductor element 11 includes an element main surface 111 and an element back surface 112. The element main surface 111 and the element back surface 112 are separated from each other in the z direction. The element main surface 111 faces the z2 side, and the element back surface 112 faces the z1 side. A source electrode (not shown) and a gate electrode (not shown) are arranged on the element main surface 111. A drain electrode (not shown) is arranged on the element back surface 112.

As shown in FIGS. 3, 7, and 9, the first semiconductor element 11 is mounted at the center of the main surface 311 of the first die pad 31 via the bonding layer 68. That is, the bonding layer 68 is interposed between the main surface 311 and the first semiconductor element 11. In the present embodiment, the bonding layer 68 has conductivity and is, for example, solder. The bonding layer 68 may be a solidified metal paste such as a solidified silver paste, or sintered metal such as sintered silver. The element back surface 112 of the first semiconductor element 11 is bonded to the metal layer 65 arranged on the main surface 311 by the bonding layer 68. The drain electrode of the first semiconductor element 11 is electrically connected to the first die pad 31 via the bonding layer 68 and the metal layer 65. As a result, the first die pad 31 (the first lead 3) conducts to the drain electrode of the first semiconductor element 11 and functions as a drain terminal.

As shown in FIG. 3, the source electrode (not shown) of the first semiconductor element 11 is electrically connected to each second lead 4 via the wire 62. As a result, the second lead 4, which conducts to the source electrode, functions as a source terminal or a sense source terminal. The sense source terminal is a terminal for detecting the potential of the source electrode. Further, as shown in FIG. 3, the gate electrode (not shown) of the first semiconductor element 11 is electrically connected to the second semiconductor element 12 via the wire 61. A drive signal is input from the second semiconductor element 12 to the gate electrode via the wire 61.

The second semiconductor element 12 is a drive element for driving the first semiconductor element 11. The second semiconductor element 12 generates the drive signal based on a control signal input from the outside, and outputs the drive signal to the first semiconductor element 11.

As shown in FIGS. 8 and 9, the second semiconductor element 12 includes an element main surface 121 and an element back surface 122. The element main surface 121 and the element back surface 122 are separated from each other in the z direction. The element main surface 121 faces the z2 side, and the element back surface 122 faces the z1 side. A plurality of electrodes (not shown) is arranged on the element main surface 121. The plurality of electrodes includes, for example, a power supply electrode to which a voltage is supplied, a ground electrode, an input electrode to which the control signal is input, and an output electrode from which the generated drive signal is output. No electrode is arranged on the element back surface 122.

As shown in FIGS. 3, 8, and 9, the second semiconductor element 12 is mounted at the center of the main surface 321 of the second die pad 32 via the bonding layer 69. That is, the bonding layer 69 is interposed between the main surface 321 and the second semiconductor element 12. In the present embodiment, the bonding layer 69 is, for example, solder. The bonding layer 69 may be a solidified metal paste, sintered metal, or the like, or may be an insulating bonding layer. The element back surface 122 of the second semiconductor element 12 is bonded to the metal layer 66 arranged on the main surface 321 by the bonding layer 69. As shown in FIG. 3, each electrode (not shown) of the second semiconductor element 12 is electrically connected to the second lead 4 via the wire 63. A second lead 4 which conducts to the power supply electrode functions as a power supply terminal, a second lead 4 which conducts to the ground electrode functions as a ground terminal, and a second lead 4 which conducts to the input electrode functions as an input terminal. Further, as shown in FIG. 3, among the electrodes (not shown) of the second semiconductor element 12, the output electrode is electrically connected to the gate electrode (not shown) of the first semiconductor element 11 via the wire 61. The second semiconductor element 12 outputs the generated drive signal from the output electrode and inputs the generated drive signal to the gate electrode of the first semiconductor element 11 via the wire 61.

As shown in FIG. 3, the wires 61 to 63, together with the conductive support member 2, form a conduction path for the first semiconductor element 11 and the second semiconductor element 12 to perform a predetermined function. The material of each of the wires 61 to 63 is metal containing, for example, Au, Ag, Cu, or Al. The material of each of the wires 61 to 63 is not particularly limited. Further, instead of the wires 61 to 63, a metal plate or a metal ribbon may be used.

The wire 61 is bonded to the gate electrode of the first semiconductor element 11 and the output electrode of the second semiconductor element 12, and forms a conduction path for inputting the drive signal, which is output from the output electrode of the second semiconductor element 12, to the gate electrode of the first semiconductor element 11. The number of wires 61 is not particularly limited. The plurality of wires 62 forms a conduction path between the first semiconductor element 11 and the plurality of second leads 4. Each of the plurality of wires 62 is bonded to any of the electrodes of the first semiconductor element 11 and the pad portion 41 of any of the second leads 4. The number of wires 62 connecting each electrode and each second lead 4 is not particularly limited. The plurality of wires 63 forms a conduction path between the second semiconductor element 12 and the plurality of second leads 4. Each of the plurality of wires 63 is bonded to any electrode of the second semiconductor element 12 and the pad portion 41 of any of the second leads 4. The number of wires 63 connecting each electrode and each second lead 4 is not particularly limited.

The sealing resin 7 covers the first semiconductor element 11, the second semiconductor element 12, the wires 61 to 63, the first lead 3, and a portion of each of the plurality of second leads 4. The sealing resin 7 has electrical insulation. The sealing resin 7 is made of a material containing, for example, a black epoxy resin. The sealing resin 7 has a rectangular shape elongated in the x direction when viewed in the z direction. The sealing resin 7 includes a top surface 71, a bottom surface 72, and side surfaces 73 to 76.

The top surface 71 and the bottom surface 72 are located apart from each other in the z direction. The top surface 71 and the bottom surface 72 face opposite sides to each other in the z direction. The top surface 71 is located on the z2 side in the z direction and faces the z2 side in the z direction, like the main surface 311 of the first die pad 31. The bottom surface 72 is located on the z1 side in the z direction and faces the z1 side in the z direction, like the back surface 312 of the first die pad 31. Each of the top surface 71 and the bottom surface 72 is substantially flat. As shown in FIG. 4, the back surface 312 of the first die pad 31 of the first lead 3 is exposed from the bottom surface 72. The bottom surface 72 and the back surface 312 are flush with each other.

Each of the side surfaces 73 to 76 is connected to the top surface 71 and the bottom surface 72, and is sandwiched between the top surface 71 and the bottom surface 72 in the z direction. The side surface 73 and the side surface 74 are located apart from each other in the y direction. The side surface 73 and the side surface 74 face opposite sides to each other in the y direction. The side surface 73 is located on the y1 side in they direction, and the side surface 74 is located on the y2 side in the y direction. The side surface 75 and the side surface 76 are located apart from each other in the x direction and are connected to the side surface 73 and the side surface 74. The side surface 75 and the side surface 76 face opposite sides to each other in the x direction. The side surface 75 is located on the x1 side in the x direction, and the side surface 76 is located on the x2 side in the x direction. A portion of each terminal portion 42 of the plurality of second leads 4 protrudes from the side surface 73. Further, a portion of each terminal portion 42 of the plurality of second leads 4 protrudes from the side surface 74. Further, as shown in FIGS. 1 and 9, the end surface 341 of the fixing portion 34 of the first lead 3 is exposed from the side surface 75. Further, as shown in FIG. 9, the end surface 351 of the fixing portion 35 of the first lead 3 is exposed from the side surface 76.

Next, an example of a method of manufacturing the semiconductor device A10 will be described.

First, a lead frame is prepared. The lead frame is a plate-shaped material. In the present embodiment, the base material of the lead frame is composed of a Cu alloy. The lead frame is formed by subjecting a metal plate to an etching process or the like. The lead frame may be formed by subjecting a metal plate to a punching process. The lead frame includes, in addition to a portion that becomes the conductive support member 2, a frame-shaped frame and a plurality of tie bars connected to the conductive support member 2 (the first lead 3 and the plurality of second leads 4) and the frame. The frame and the tie bars do not constitute the semiconductor device A10. The lead frame includes the first die pad 31, the second die pad 32, and a portion of a rectangular shape (hereinafter, referred to as a "rectangular portion") that becomes the connecting portion 33 of the first lead 3.

Next, a depressing process is performed for the lead frame. In the present embodiment, the depressing process is performed twice. By the first depressing process, the lead frame is deformed so that the rectangular portion is located on the z1 side in the z direction from the frame. At this time, a portion connected to the rectangular portion and the frame is deformed to form the fixing portion 35. Next, by the second depressing process, the rectangular portion is deformed to form the second die pad 32, the first die pad 31 located on the z1 side in the z direction with respect to the second die pad 32, and the connecting portion 33 connected to the first die pad 31 and the second die pad 32. At this time, a portion connected to the first die pad 31 and the frame is deformed to form the fixing portion 34. Further, the rectangular portion may be deformed into the first die pad 31, the second die pad 32, and the connecting portion 33 by performing a depressing process once.

Next, the metal layer 65 is formed on the main surface 311 of the first die pad 31 by, for example, a plating process. Further, the metal layer 66 is formed on the main surface 321 of the second die pad 32 by, for example, a plating process.

Next, the first semiconductor element 11 is bonded to the metal layer 65 formed on the main surface 311 of the first die pad 31 via the bonding layer 68, and the second semiconductor element 12 is bonded to the metal layer 66 formed on the main surface 321 of the second die pad 32 via the bonding layer 69. In this bonding process, first, a solder paste that becomes the bonding layers 68 and 69 is applied to the center of each of the metal layers 65 and 66. Next, the first semiconductor element 11 and the second semiconductor element 12 are mounted on the applied solder paste. Next, a reflow process is performed to melt the solder paste and then solidify the molten solder paste. Since the metal layers 65 and 66 have better solder wettability than the lead frame, it is possible to prevent the molten solder paste from flowing beyond the boundary between the metal layers 65 and 66 and the lead frame.

Next, each of the wires 61 to 63 is formed by wire bonding. Next, the sealing resin 7 is formed. The sealing resin 7 is formed, for example, by transfer molding. Next, dicing for fragmentation is performed to appropriately separate the first lead 3 and the plurality of second leads 4, which are connected to one another by the frame and the plurality of tie bars. Next, a portion of the plurality of second leads 4 that protrudes from the sealing resin 7 is bent. By going through the processes described above, the semiconductor device A10 is manufactured.

Next, operative effects of the semiconductor device A10 will be described.

According to the present embodiment, the first lead 3 includes the first die pad 31 and the second die pad 32. The second die pad 32 is arranged side by side with the first die pad 31 in the x direction, but is arranged at a position different from that of the first die pad 31 in the z direction. The first semiconductor element 11 is mounted on the main surface 311 of the first die pad 31, and the second semiconductor element 12 is mounted on the main surface 321 of the second die pad 32. Therefore, the first semiconductor element 11 and the second semiconductor element 12 are mounted side by side on the common first lead 3 in the x direction, but are arranged at different positions in the z direction. As a result, in the semiconductor device A10, it is possible to prevent the first semiconductor element 11 and the second semiconductor element 12 from being mounted in a state where the first semiconductor element 11 and the second semiconductor element 12 come into contact with each other, as compared with a case where the first semiconductor element 11 and the second semiconductor element 12 are arranged at the same position in the z direction. Further, the first semiconductor element 11 is mounted on the main surface 311 of the first die pad 31 via the bonding layer 68, and the second semiconductor element 12 is mounted on the main surface 321 of the second die pad 32 via the bonding layer 69. In the semiconductor device A10, since the first die pad 31 and the second die pad 32 are arranged at different positions in the z direction, it is also possible to prevent the bonding layer 68 and the bonding layer 69 from coming into contact with each other, as compared with a case where the first die pad 31 and the second die pad 32 are arranged at the same position in the z direction.

Further, according to the present embodiment, the back surface 312 of the first die pad 31 is exposed from the bottom surface 72 of the sealing resin 7. The back surface 312 is bonded to the wiring board when the semiconductor device A10 is mounted on the wiring board. Therefore, heat generated by the first semiconductor element 11 is released from the back surface 312 to the wiring board. As a result, the semiconductor device A10 can appropriately dissipate the heat of the first semiconductor element 11.

Further, according to the present embodiment, the metal layer 66 is interposed between the main surface 321 of the second die pad 32 and the second semiconductor element 12. The metal layer 66 is made of a material having better solder wettability than the material of the second die pad 32. Therefore, it is possible to prevent the solder paste melted during manufacturing from flowing beyond the boundary between the metal layer 66 and the main surface 321. As a result, in the semiconductor device A10, it is possible to prevent the molten solder paste from flowing on the main surface 331 of the connecting portion 33. Further, according to the present embodiment, the metal layer 65 is interposed between the main surface 311 of the first die pad 31 and the first semiconductor element 11. The metal layer 65 is made of a material having better solder wettability than the material of the first die pad 31. Therefore, in the semiconductor device A10, it is possible to prevent the solder paste melted during manufacturing from flowing beyond the boundary between the metal layer 65 and the main surface 311.

In the present embodiment, the case where the metal layer 65 is arranged at the center of the main surface 311 so as to be contained in the main surface 311 when viewed in the z direction has been described, but the present disclosure is not limited thereto. The shape of the metal layer 65 is not particularly limited, and the metal layer 65 may not be contained in the main surface 311. For example, the metal layer 65 may cover the entire main surface 311. Further, the metal layer 65 may not be arranged. Further, in the present embodiment, the case where the metal layer 66 is arranged at the center of the main surface 321 so as to be contained in the main surface 321 when viewed in the z direction has been described, but the present disclosure is not limited thereto. The shape of the metal layer 66 is not particularly limited, and the metal layer 66 may not be contained in the main surface 321. For example, the metal layer 66 may cover the entire main surface 321. Further, the metal layer 66 may not be arranged.

Further, in the present embodiment, the case where the back surface 312 of the first die pad 31 is exposed from the bottom surface 72 of the sealing resin 7 has been described, but the present disclosure is not limited thereto. The back surface 312 may not be exposed from the bottom surface 72 of the sealing resin 7.

Further, in the present embodiment, the case where the package format of the semiconductor device A10 is SOP (Small Outline Package) has been described, but the present disclosure is not limited thereto. The package format of the semiconductor device A10 is not limited to SOP.

Further, in the present embodiment, the case where the first semiconductor element 11 is a switching element and the second semiconductor element 12 is a drive element has been described, but the present disclosure is not limited thereto. The second semiconductor element 12 may be a switching element, and the first semiconductor element 11 may be a drive element. Further, the first semiconductor element 11 and the second semiconductor element 12 may be other semiconductor elements, or may be electronic components other than the semiconductor elements.

Further, in the present embodiment, the case where only the first semiconductor element 11 is mounted on the first die pad 31 and only the second semiconductor element 12 is mounted on the second die pad 32 has been described, but the present disclosure is not limited thereto. Other semiconductor elements or electronic components may be mounted on the first die pad 31, or the first semiconductor element 11 may not be mounted on the first die pad 31. Further, other semiconductor elements or electronic components may be mounted on the second die pad 32, or the second semiconductor element 12 may not be mounted on the second die pad 32.

FIGS. 10 to 22 show other embodiments of the present disclosure. In these figures, the same or similar elements as those in the above embodiment are denoted by the same reference numerals as those in the above embodiment.

Second Embodiment

Figure 10:
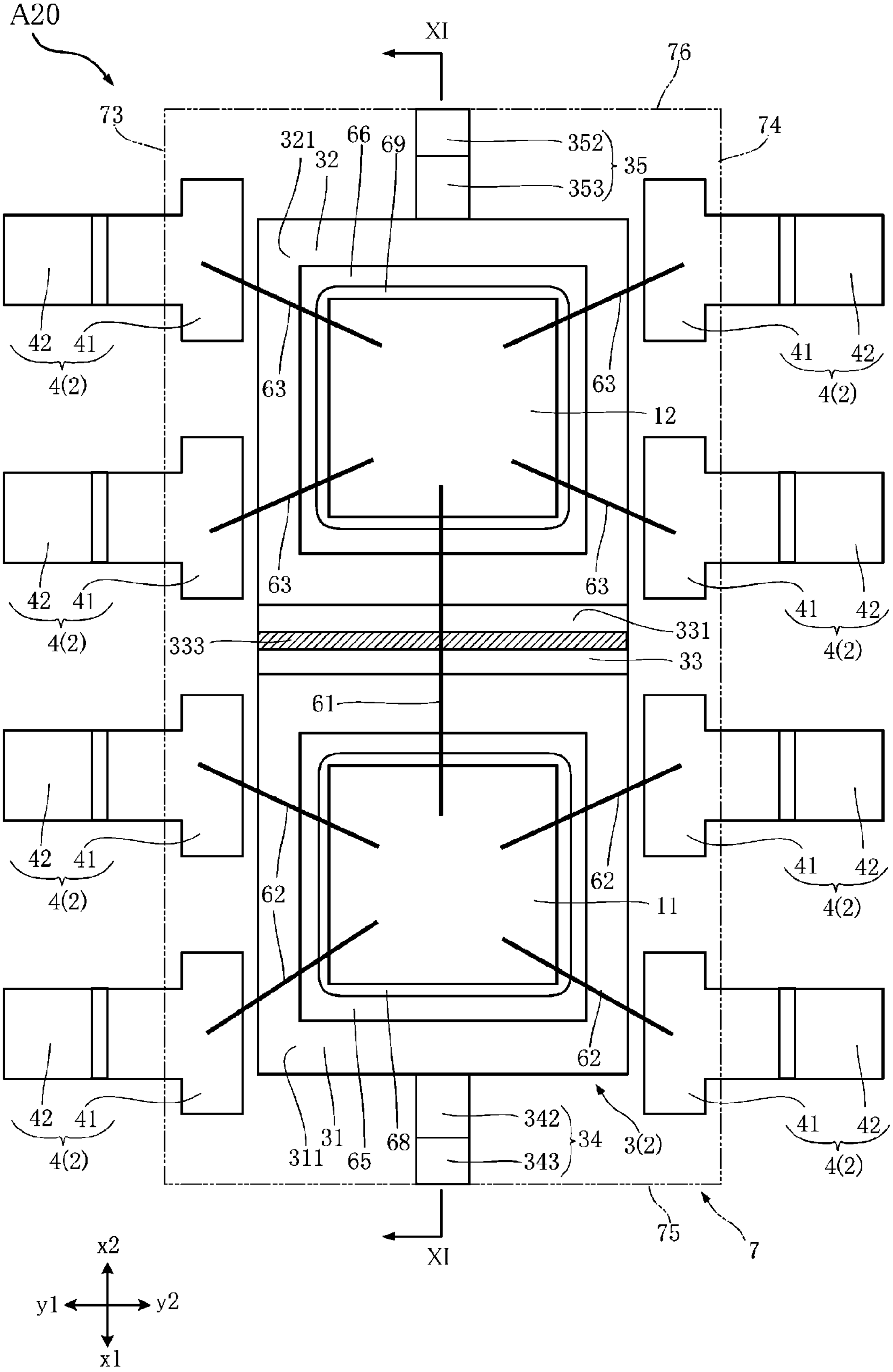
FIG. 10 is a plan view showing a semiconductor device according to a second embodiment of the present disclosure, wherein a sealing resin is transparent.
Figure 11:
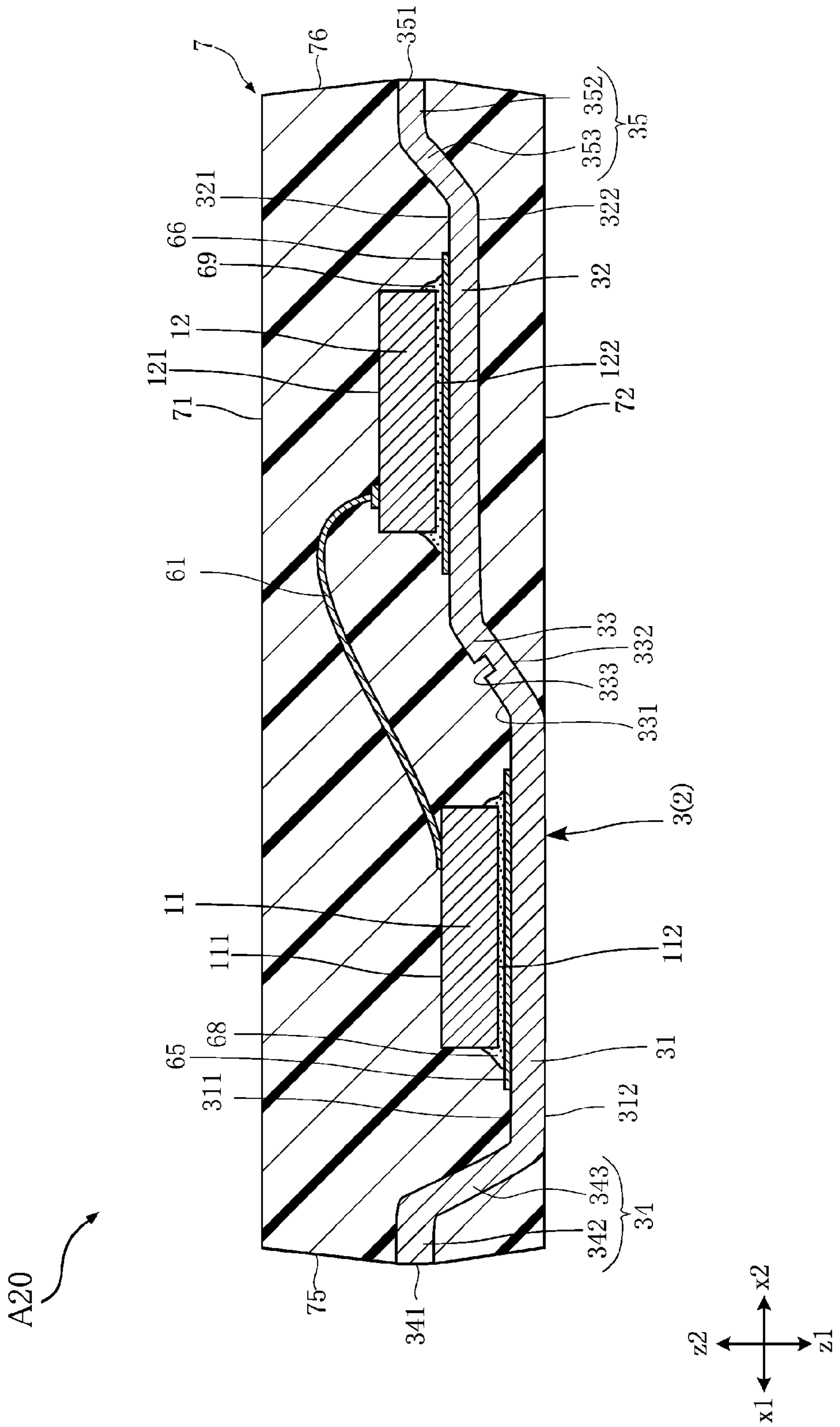
FIG. 11 is a cross-sectional view taken along line XI-XI in FIG. 10.
Figure 12:
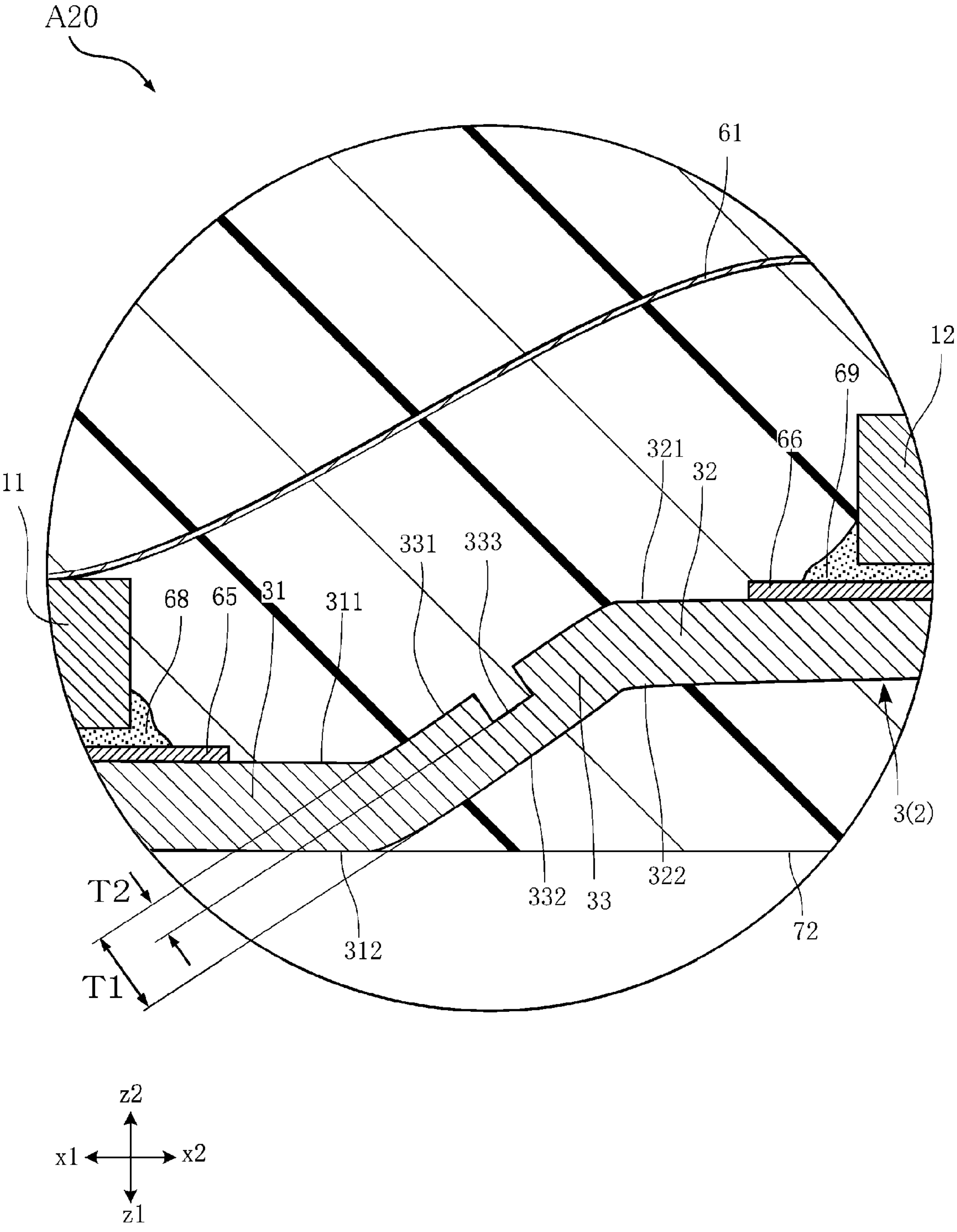
FIG. 12 is a partially-enlarged view of FIG. 11.

FIGS. 10 to 12 are views for explaining a semiconductor device A20 according to a second embodiment of the present disclosure. FIG. 10 is a plan view showing the semiconductor device A20 and is a view corresponding to FIG. 3. For the sake of convenience of understanding, in FIG. 10, the sealing resin 7 is transparent and the outer shape of the sealing resin 7 is indicated by an imaginary line (a two-dot chain line). FIG. 11 is a cross-sectional view taken along line XI-XI of FIG. 10 and is a view corresponding to FIG. 9. FIG.

12 is a partially-enlarged view of FIG. 11. The semiconductor device A20 of the present embodiment is different from the first embodiment in that the connecting portion 33 includes a groove portion. The configurations and operations of other parts of the present embodiment are the same as those of the first embodiment. In addition, various parts of the first embodiment may be arbitrarily combined.

In the present embodiment, the connecting portion 33 includes a groove portion 333. In FIG. 10, for the sake of convenience of understanding, the groove portion 333 is hatched. The groove portion 333 is arranged near the center of the main surface 331 of the connecting portion 33 in the x direction. The groove portion 333 is recessed from the main surface 331 of the connecting portion 33 toward the back surface 332 and extends along the y direction. In the present embodiment, the groove portion 333 extends to both end edges of the main surface 331 in they direction. As shown in FIG. 12, the shape of the groove portion 333 when viewed in the y direction is substantially rectangular. The shape of the groove portion 333 when viewed in the y direction is not particularly limited, and may be, for example, semicircular. The groove portion 333 is formed by, for example, half etching when the lead frame is manufactured. A method of forming the groove portion 333 is not particularly limited. The groove portion 333 may be formed so as to be recessed from the main surface 331 by, for example, stamping.

The groove portion 333 is provided to hinder a flow of a molten solder paste during a reflow process in a manufacturing process. The solder paste for bonding the second semiconductor element 12 to the lead frame is melted by the reflow process. At this time, the molten solder paste may flow beyond the boundary between the metal layer 66 and the lead frame and flow out from the main surface 321 of the second die pad 32 to the main surface 331 of the connecting portion 33. The groove portion 333 is provided to prevent the molten solder paste that has flowed out to the main surface 331 of the connecting portion 33 from flowing to the main surface 311 of the first die pad 31.

A depth dimension (the dimension in a direction orthogonal to the main surface 331) T2 of the groove portion 333 is about ⅓ of a thickness dimension (the dimension in the direction orthogonal to the main surface 331) T1 of the connecting portion 33. When the dimension T2 is too large, the strength of the connecting portion 33 becomes weak. On the other hand, when the dimension T2 is too small, the function of inhibiting the flow of the melted solder paste deteriorates. It is desirable to set the dimension T2 to be ¼ or more and ½ or less of the dimension T1. The dimension T2 is not particularly limited. The dimension T2 may be appropriately determined according to the dimension T1 of the connecting portion 33, the strength of the connecting portion 33, the arrangement position of the second semiconductor element 12 on the second die pad 32, the amount of the solder paste to be applied, and the like.

It is sufficient if the groove portion 333 can inhibit the flow of the molten solder paste. The groove portion 333 does not have to extend to both end edges of the main surface 331 in the y direction. Further, the groove portion 333 may be a broken line-shaped groove in which a plurality of grooves extending in they direction is arranged in they direction. Further, the groove portion 333 may be curved, for example, instead of extending linearly. Further, the arrangement position of the groove portion 333 is not limited to the vicinity of the center of the main surface 331 in the x direction. Further, a plurality of groove portions 333 may be arranged side by side in the x direction.

Also in the present embodiment, since the second die pad 32 is arranged at a position different from that of the first die pad 31 in the z direction, the first semiconductor element 11 and the second semiconductor element 12 are arranged at different positions in the z direction. As a result, in the semiconductor device A20, it is possible to prevent the first semiconductor element 11 and the second semiconductor element 12 from being mounted in a state where the first semiconductor element 11 and the second semiconductor element 12 are in contact with each other. Further, in the semiconductor device A20, it is possible to prevent the bonding layer 68 and the bonding layer 69 from coming into contact with each other. Further, also in the present embodiment, since the back surface 312 of the first die pad 31 is exposed from the bottom surface 72 of the sealing resin 7, the semiconductor device A20 can appropriately dissipate the heat of the first semiconductor element 11. Further, also in the present embodiment, the metal layer 66 is interposed between the main surface 321 of the second die pad 32 and the second semiconductor element 12. Therefore, in the semiconductor device A20, it is possible to prevent the solder paste that has melted during manufacturing from flowing through the main surface 331 of the connecting portion 33 beyond the boundary between the metal layer 66 and the main surface 321.

Further, according to the present embodiment, the connecting portion 33 includes the groove portion 333. The groove portion 333 can prevent the solder paste that has melted during manufacturing from flowing to the main surface 311 of the first die pad 31 even when the solder paste flows out from the main surface 321 of the second die pad 32 to the main surface 331 of the connecting portion 33. Therefore, it is possible to prevent an increase in the amount of solder paste for bonding the first semiconductor element 11 due to addition of a part of the solder paste for bonding the second semiconductor element 12 to the solder paste for bonding the first semiconductor element 11. As a result, in the semiconductor device A20, it is possible to prevent the first semiconductor element 11 from being moved and misaligned due to the increased solder paste.

In the present embodiment, the case where the bonding layer 69 is solder has been described, but the present disclosure is not limited thereto. The bonding layer 69 may be a solidified metal paste such as a solidified silver paste, sintered metal such as sintered silver, or an insulating bonding layer. Even in these cases, some components contained in the material of the bonding layer 69 may flow out in the reflow process for forming the bonding layer 69. The groove portion 333 can prevent the fluid from flowing on the main surface 331 of the connecting portion 33.

<First Modification>

Figure 13:
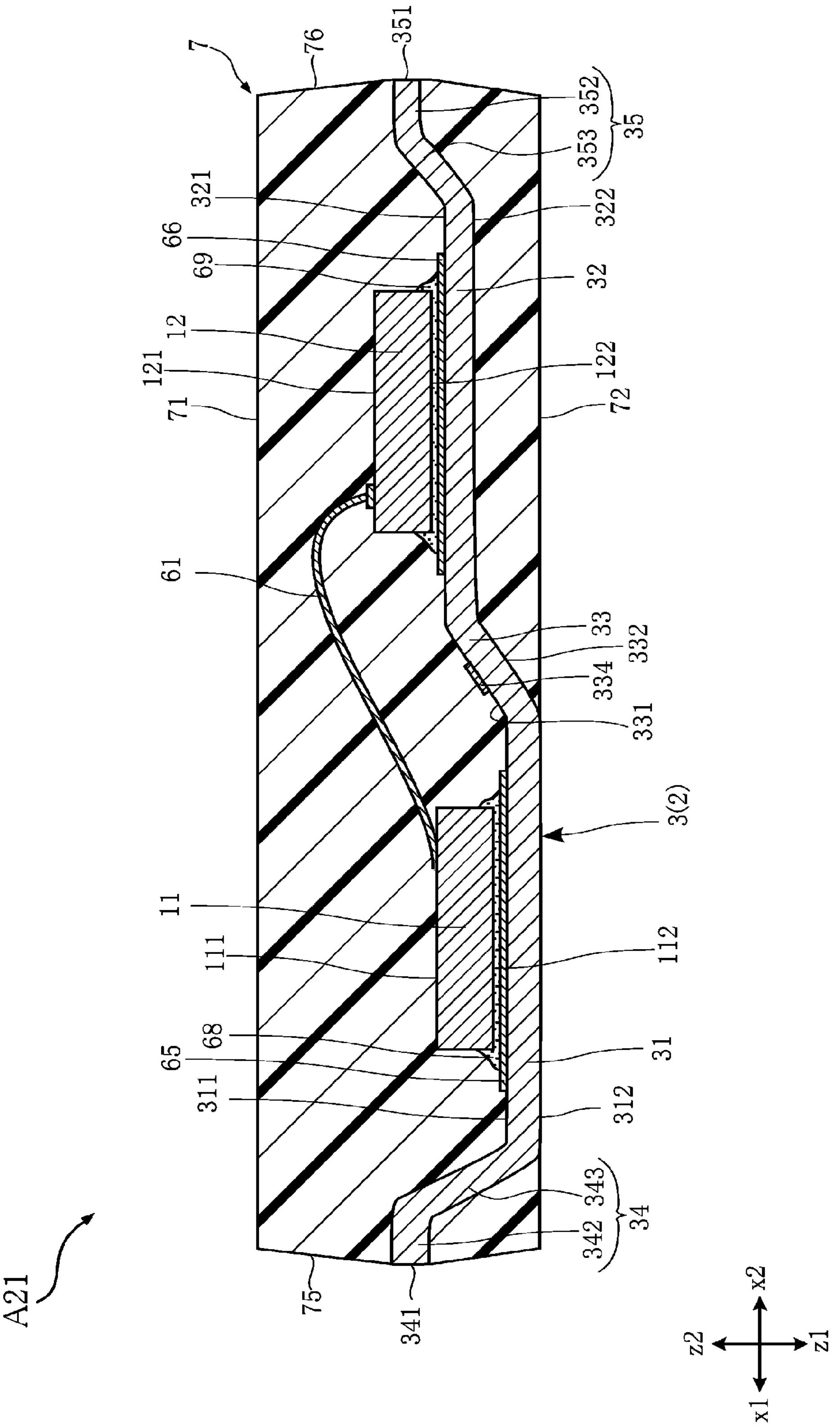
FIG. 13 is a cross-sectional view showing a semiconductor device according to a first modification of the second embodiment of the present disclosure.
Figure 14:
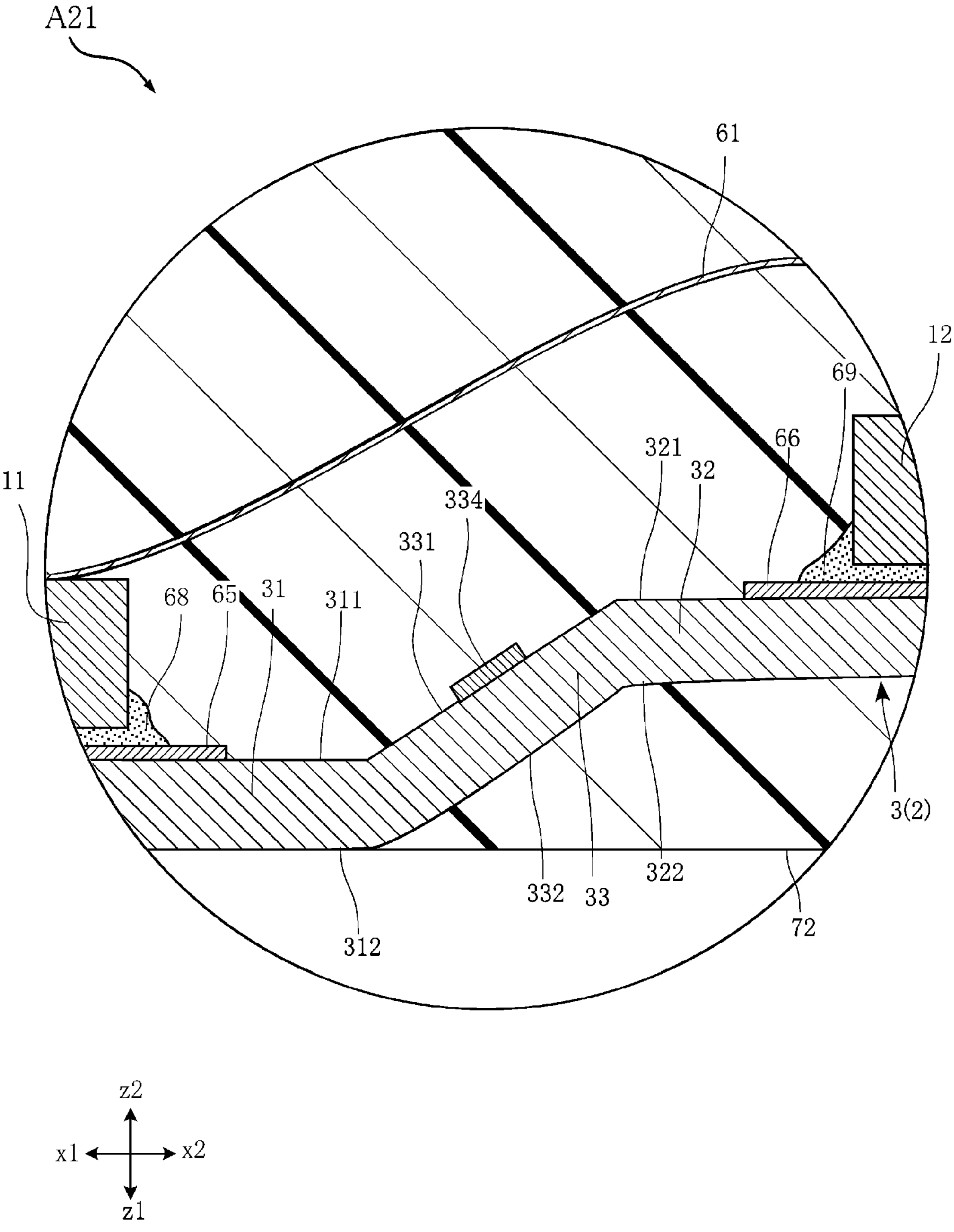
FIG. 14 is a partially-enlarged view of FIG. 13.

FIGS. 13 and 14 are views for explaining a semiconductor device A21 according to a first modification of the second embodiment. FIG. 13 is a cross-sectional view showing the semiconductor device A21 and is a view corresponding to FIG. 11. FIG. 14 is a partially-enlarged view of FIG. 13. The semiconductor device A21 of this modification is different from the semiconductor device A20 in that the connecting portion 33 includes a metal layer instead of the groove portion 333.

In this modification, the connecting portion 33 includes a metal layer 334 instead of the groove portion 333. The metal layer 334 is arranged in the vicinity of the center of the main surface 331 of the connecting portion 33 in the x direction. The metal layer 334 protrudes from the main surface 331 of the connecting portion 33 and extends along they direction. In this modification, the metal layer 334 extends to both end edges of the main surface 331 in the y direction. As shown in FIG. 14, the shape of the metal layer 334 when viewed in the y direction is substantially rectangular. The shape of the metal layer 334 when viewed in the y direction is not particularly limited.

The metal layer 334 is a plating layer formed by, for example, a plating process. The metal layer 334 may be formed by other methods. As the material of the metal layer 334, a material having poorer solder wettability than the material of the connecting portion 33 is used. The metal layer 334 may be made of, for example, Al (aluminum). Further, for example, when the first die pad 31 is made of Cu, the metal layer 334 may be a Cu alloy having poorer solder wettability than Cu. Further, the metal layer 334 is not limited to one composed of a single layer, but may be one in which a plurality of metal layers are stacked. Like the groove portion 333, the metal layer 334 is provided to inhibit the flow of a molten solder paste during a reflow process in a manufacturing process. Since the metal layer 334 is made of a material having poorer solder wettability than the material of the connecting portion 33, the flow of the molten solder paste can be inhibited. The material of the metal layer 334 is not particularly limited as long as a height dimension (the dimension in a direction orthogonal to the main surface 331) of the metal layer 334 can be formed sufficiently high and the flow of the molten solder paste can be inhibited by the height of the metal layer 334.

It is sufficient if the metal layer 334 can inhibit the flow of the molten solder paste. The metal layer 334 does not have to extend to both end edges of the main surface 331 in the y direction. Further, the metal layer 334 may be a broken line-shaped plating layer in which a plurality of plating layers extending in the y direction is arranged in the y direction. Further, the metal layer 334 may be curved, for example, instead of extending linearly. Further, the arrangement position of the metal layer 334 is not limited to the vicinity of the center of the main surface 331 in the x direction. Further, a plurality of metal layers 334 may be arranged side by side in the x direction.

The semiconductor device A21 can also have the same effects as the semiconductor device A20.

<Second Modification>

Figure 15:
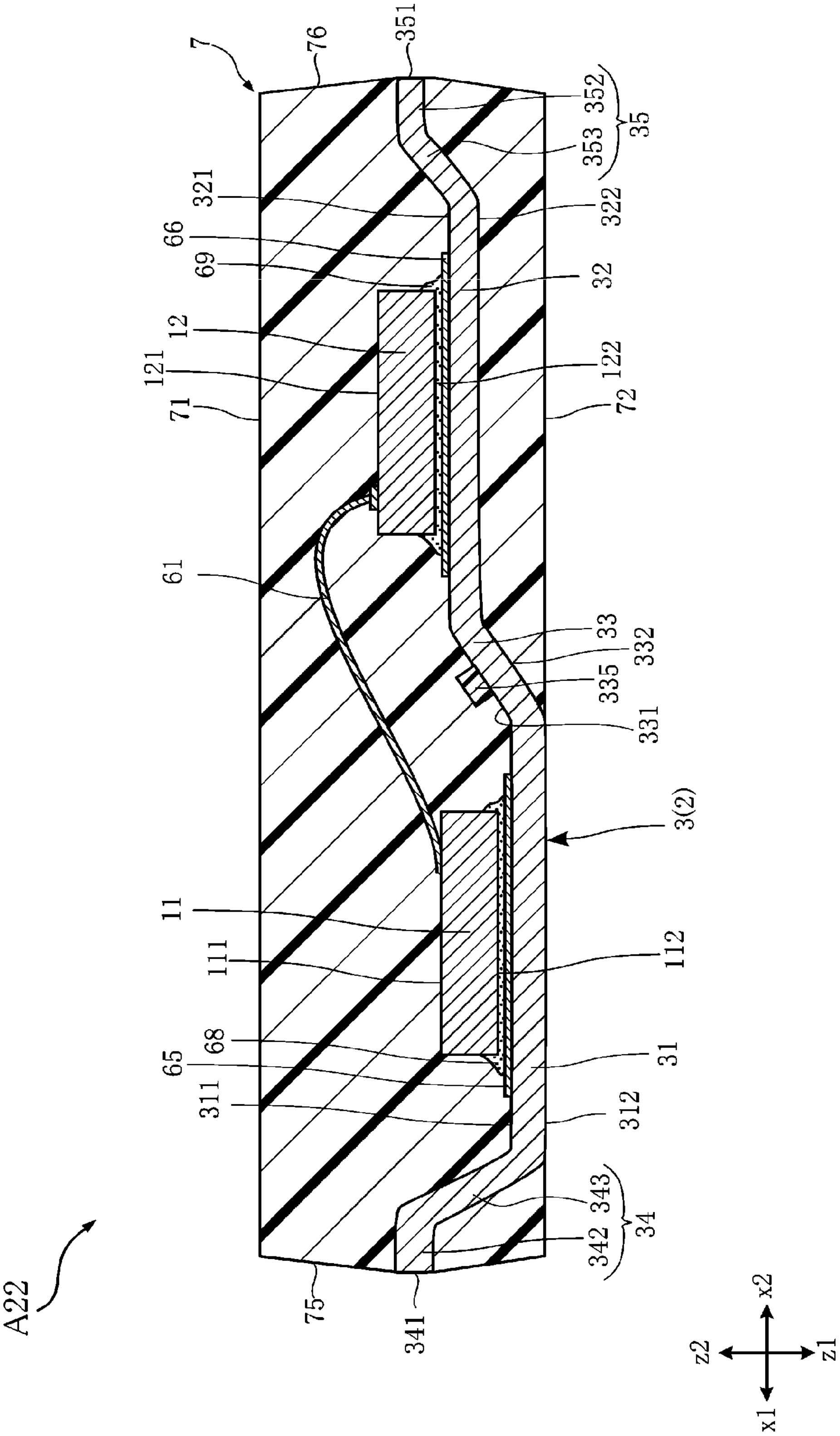
FIG. 15 is a cross-sectional view showing a semiconductor device according to a second modification of the second embodiment of the present disclosure.
Figure 16:
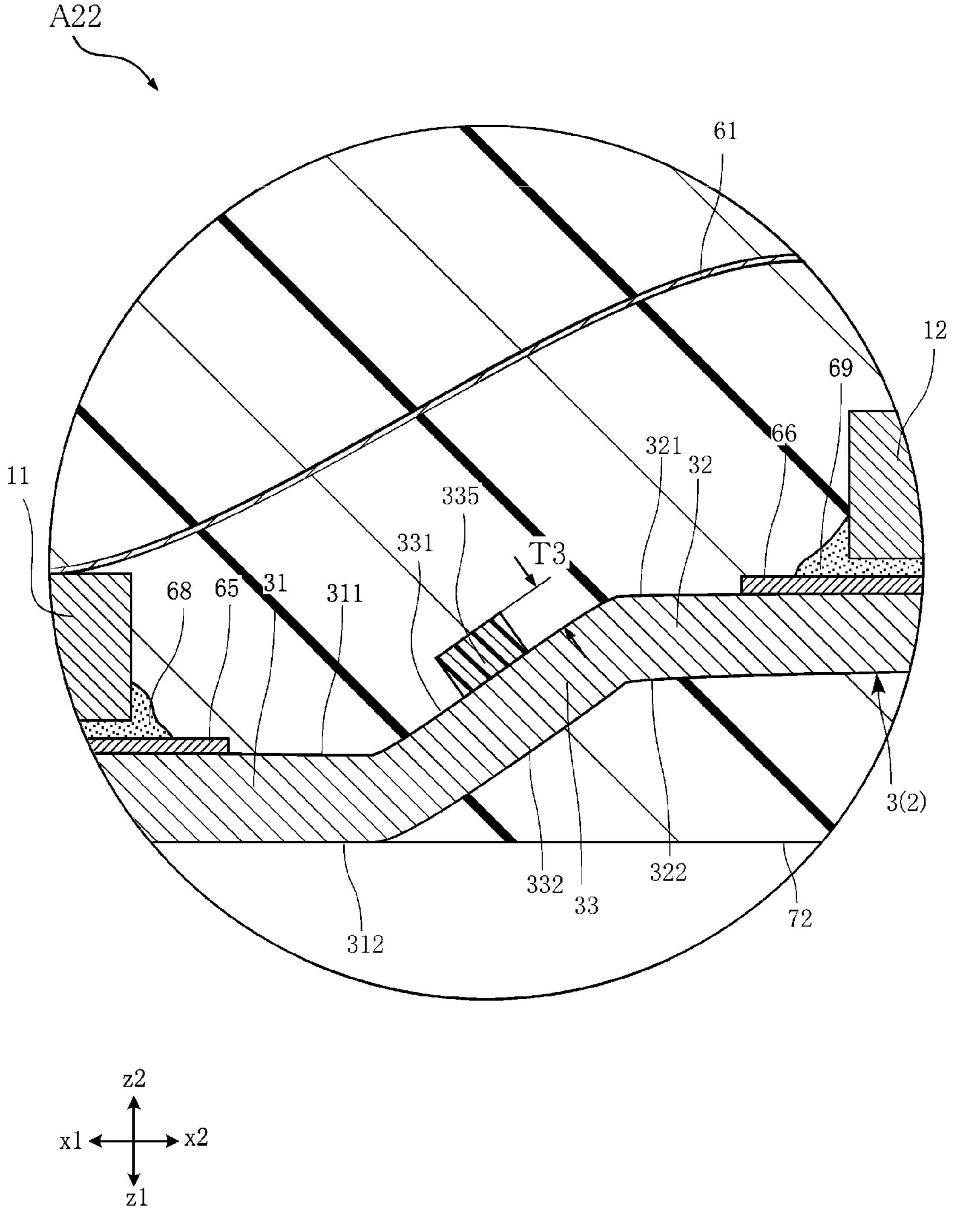
FIG. 16 is a partially-enlarged view of FIG. 15.

FIGS. 15 and 16 are views for explaining a semiconductor device A22 according to a second modification of the second embodiment. FIG. 15 is a cross-sectional view showing the semiconductor device A22 and is a view corresponding to FIG. 11. FIG. 16 is a partially-enlarged view of FIG. 15. The semiconductor device A22 of this modification is different from the semiconductor device A20 in that the connecting portion 33 includes a paste layer instead of the groove portion 333.

In this modification, the connecting portion 33 includes a paste layer 335 instead of the groove portion 333. The paste layer 335 is arranged in the vicinity of the center of the main surface 331 of the connecting portion 33 in the x direction. The paste layer 335 protrudes from the main surface 331 of the connecting portion 33 and extends along they direction. In this modification, the paste layer 335 extends to both end edges of the main surface 331 in the y direction. As shown in FIG. 16, the shape of the paste layer 335 when viewed in they direction is substantially rectangular. The shape of the paste layer 335 when viewed in the y direction is not particularly limited. It is desirable that a height dimension (the dimension in a direction orthogonal to the main surface 331) T3 of the paste layer 335 is 20 μm or more. The dimension T3 is not particularly limited.

The paste layer 335 is formed by, for example, applying an insulating paste on the main surface 331 of the connecting portion 33 and solidifying the applied insulating paste. Further, the paste layer 335 may be formed by applying a conductive paste on the main surface 331 of the connecting portion 33 and solidifying the applied conductive paste. Further, the paste layer 335 may be formed by other methods. For example, the paste layer 335 may be formed by attaching a die attach film to the main surface 331. The material of the paste layer 335 may be any material that can withstand the heat of a reflow process. Like the groove portion 333, the paste layer 335 is provided to inhibit a flow of a molten solder paste during a reflow processing in a manufacturing process.

It is sufficient if the paste layer 335 can inhibit the flow of the molten solder paste. The paste layer 335 does not have to extend to both end edges of the main surface 331 in the y direction. Further, the paste layer 335 may have a broken line shape in which a plurality of layers extending in the y direction is arranged in the y direction. Further, the paste layer 335 may be curved, for example, instead of extending linearly. Further, the arrangement position of the paste layer 335 is not limited to the vicinity of the center of the main surface 331 in the x direction. Further, a plurality of paste layers 335 may be arranged side by side in the x direction.

The semiconductor device A22 can also have the same effects as the semiconductor device A20.

Third Embodiment

Figure 17:
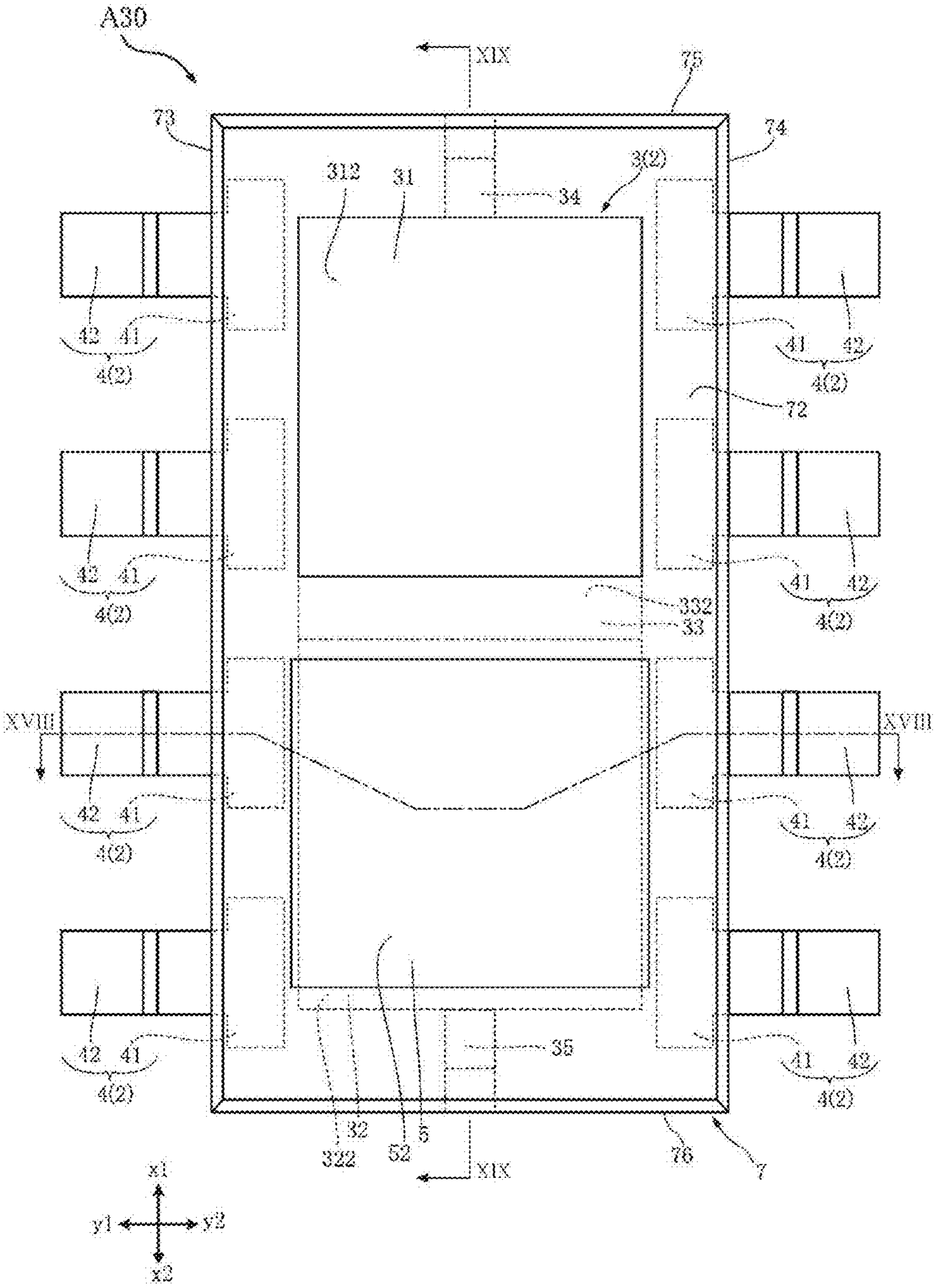
FIG. 17 is a bottom view showing a semiconductor device according to a third embodiment of the present disclosure.
Figure 18:
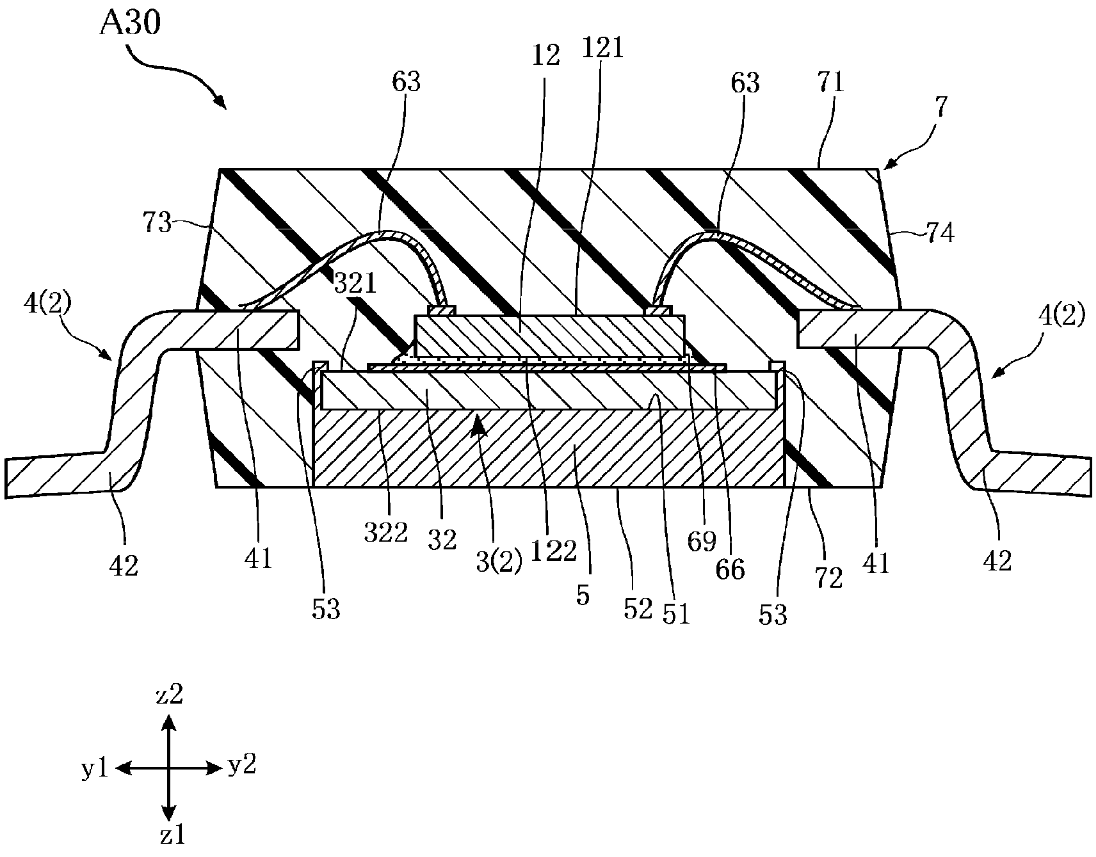
FIG. 18 is a cross-sectional view taken along line XVIII-XVIII in FIG. 17.
Figure 19:
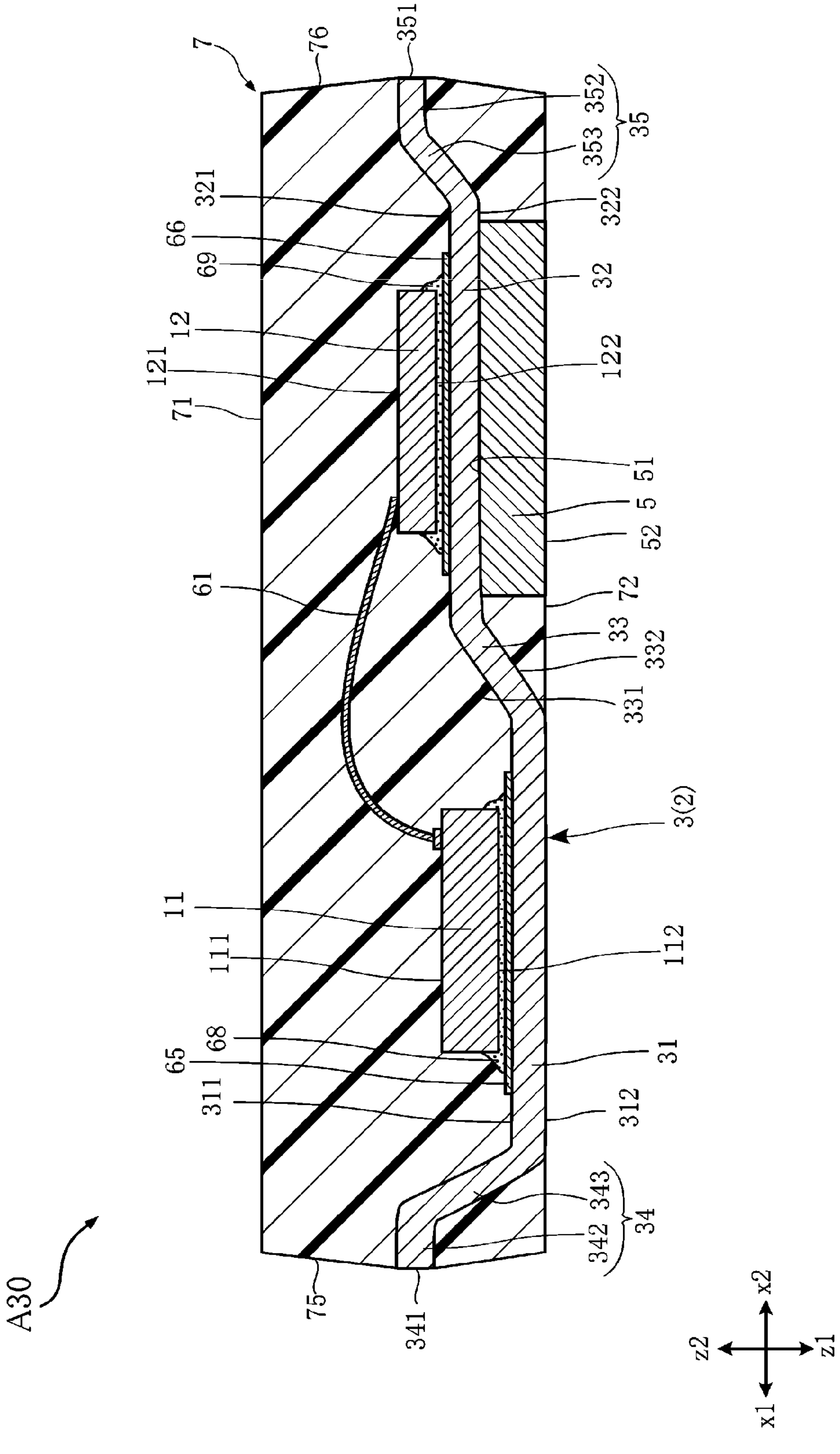
FIG. 19 is a cross-sectional view taken along line XIX-XIX in FIG. 17.

FIGS. 17 to 19 are views for explaining a semiconductor device A30 according to a third embodiment of the present disclosure. FIG. 17 is a bottom view showing the semiconductor device A30 and is a view corresponding to FIG. 4. FIG. 18 is a cross-sectional view showing the semiconductor device A30 and is a view corresponding to FIG. 8. FIG. 19 is a cross-sectional view showing the semiconductor device A30 and is a view corresponding to FIG. 9. The semiconductor device A30 of the present embodiment is different from that of the first embodiment in that the former further includes a heat transfer member. The configurations and operations of other parts of the present embodiment are the same as those of the first embodiment. In addition, various parts of the first and second embodiments may be arbitrarily combined.

In the present embodiment, the second semiconductor element 12 is a switching element, and the second semiconductor element 11 is a drive element that drives the second semiconductor element 12. Further, one having a small thickness dimension (dimension in the z direction) is adopted as the second semiconductor element 12, and as shown in FIG. 19, the thickness dimension thereof is smaller than that of the first semiconductor element 11.

Further, in the present embodiment, the semiconductor device A30 further includes a heat transfer member 5. The heat transfer member 5 is a conductor and is made of, for example, Cu. The material of the heat transfer member 5 is not particularly limited, and may be any material having high thermal conductivity. The heat transfer member 5 has substantially a rectangular parallelepiped shape and is arranged on the back surface 322 of the second die pad 32. The heat transfer member 5 includes a main surface 51 and a back surface 52. The main surface 51 and the back surface 52 are separated from each other in the z direction, as shown in FIGS. 18 and 19. The main surface 51 faces the z2 side, and the back surface 52 faces the z1 side. The main surface 51 and the back surface 52 are substantially flat. The main surface 51 is in contact with the back surface 322 of the second die pad 32. Further, a sheet having high thermal conductivity may be arranged between the main surface 51 of the heat transfer member 5 and the back surface 322 of the second die pad 32. As shown in FIG. 17, the back surface 52 is exposed from the bottom surface 72 of the sealing resin 7 to form a back surface terminal, and is bonded to a wiring board on which the semiconductor device A30 is mounted.

Further, the heat transfer member 5 includes two engaging portions 53. The engaging portions 53 protrude toward the z2 side in the z direction from both end portions of the main surface 51 in they direction, respectively, and engage with the second die pad 32. The heat transfer member 5 is attached to the second die pad 32 by caulking. Specifically, the engaging portions 53 of the heat transfer member 5 are engaged with both end portions of the second die pad 32 in the y direction from the back surface 322 side of the second die pad 32. Then, heat is applied, and the main surface 51 is attached to the back surface 322 of the second die pad 32 by being pressed to be in close contact with the back surface 322 of the second die pad 32. The arrangement position, shape, and number of the engaging portions 53 are not particularly limited. Further, a method of attaching the heat transfer member 5 is not particularly limited. For example, the heat transfer member 5 may be attached to the second die pad 32 by providing through-holes in the second die pad 32, passing the engaging portions 53 through the through-holes, and then crushing the leading end portions thereof. The heat transfer member 5 may be attached to the second die pad 32 so that heat can be appropriately transferred from the second die pad 32.

Also in the present embodiment, since the second die pad 32 is arranged at a position different from that of the first die pad 31 in the z direction, the first semiconductor element 11 and the second semiconductor element 12 are arranged at different positions in the z direction. As a result, in the semiconductor device A30, it is possible to prevent the first semiconductor element 11 and the second semiconductor element 12 from being mounted in a state where the first semiconductor element 11 and the second semiconductor element 12 are in contact with each other. Further, in the semiconductor device A30, it is also possible to prevent the bonding layer 68 and the bonding layer 69 from coming into contact with each other. Further, also in the present embodiment, since the back surface 312 of the first die pad 31 is exposed from the bottom surface 72 of the sealing resin 7, the semiconductor device A30 can appropriately dissipate the heat of the first semiconductor element 11. Further, also in the present embodiment, the metal layer 66 is interposed between the main surface 321 of the second die pad 32 and the second semiconductor element 12. Therefore, in the semiconductor device A30, it is possible to prevent the solder paste that has melted during manufacturing from flowing through the main surface 331 of the connecting portion 33 beyond the boundary between the metal layer 66 and the main surface 321.

Further, according to the present embodiment, the semiconductor device A30 includes the heat transfer member 5. The heat transfer member 5 is made of a material having high thermal conductivity, the main surface 51 thereof is in contact with the back surface 322 of the second die pad 32, and the back surface 52 thereof is exposed from the sealing resin 7. The back surface 52 is bonded to the wiring board when the semiconductor device A30 is mounted on the wiring board. Therefore, the heat generated by the second semiconductor element 12 is released from the back surface 52 of the heat transfer member 5 to the wiring board via the second die pad 32. As a result, the semiconductor device A30 can appropriately dissipate the heat of the second semiconductor element 12.

Further, according to the present embodiment, the second semiconductor element 12 has a smaller thickness dimension than the first semiconductor element 11. Therefore, as compared with a case where the thickness dimensions are the same, in a state where the first semiconductor element 11 and the second semiconductor element 12 are mounted on the first lead 3, the position of the element main surface 111 of the first semiconductor element 11 and the position of the element main surface 121 of the second semiconductor element 12 in the z direction are close to each other. This facilitates the formation of the wire 61 and suppresses the occurrence of defects in the wire 61.

In the present embodiment, the case where the back surface 312 of the first die pad 31 is exposed from the bottom surface 72 of the sealing resin 7 has been described, but the present disclosure is not limited thereto. In the present embodiment, since heat dissipation and conduction are enabled via the heat transfer member 5, the back surface 312 of the first die pad 31 does not have to be exposed from the sealing resin 7.

<First Modification>

Figure 20:
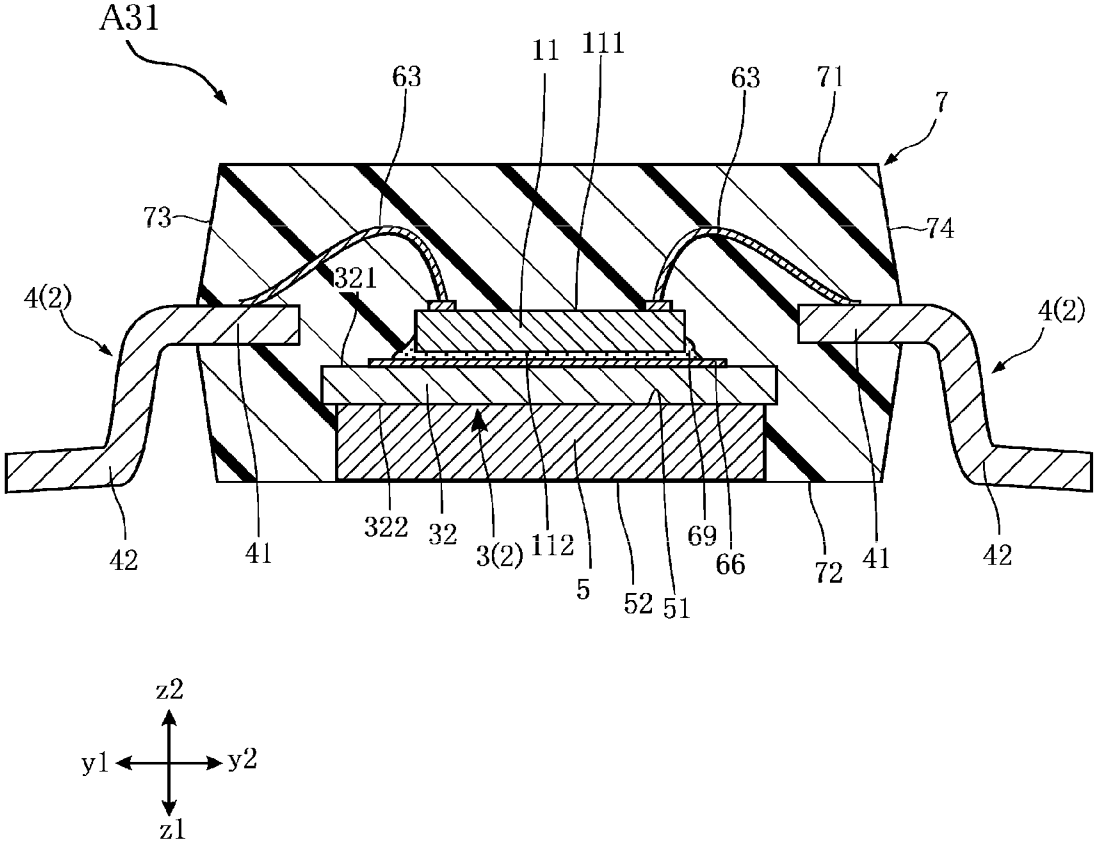
FIG. 20 is a cross-sectional view showing a semiconductor device according to a first modification of the third embodiment of the present disclosure.

FIG. 20 is a view for explaining a semiconductor device A31 according to a first modification of the third embodiment. FIG. 20 is a cross-sectional view showing the semiconductor device A31 and is a view corresponding to FIG. 18. The semiconductor device A31 of this modification is different from the semiconductor device A30 in a method of attaching the heat transfer member 5.

In this modification, the heat transfer member 5 does not have the engaging portions 53, and the main surface 51 of the heat transfer member 5 is bonded to the back surface 322 of the second die pad 32 via a conductive bonding material (not shown). The bonding material for bonding the heat transfer member 5 to the second die pad 32 may be an insulating bonding material. The bonding material may be any material having high thermal conductivity. Further, a method of bonding the heat transfer member 5 to the back surface 322 of the second die pad 32 may be ultrasonic bonding, spot welding, or the like. The semiconductor device A31 can also have the same effects as the semiconductor device A30.

In the third embodiment, the case where the heat transfer member 5 is a conductor has been described, but the present disclosure is not limited thereto. The heat transfer member 5 may be an insulator such as aluminum oxide (alumina). Further, the heat transfer member 5 may be made of a resin material having high thermal conductivity. The material of the heat transfer member 5 is not particularly limited, and may be any material having high thermal conductivity. Further, the heat transfer member 5 may be attached to the second die pad 32 so that the heat from the second die pad 32 can be appropriately transferred, by using techniques known in the art.

Fourth Embodiment

Figure 21:
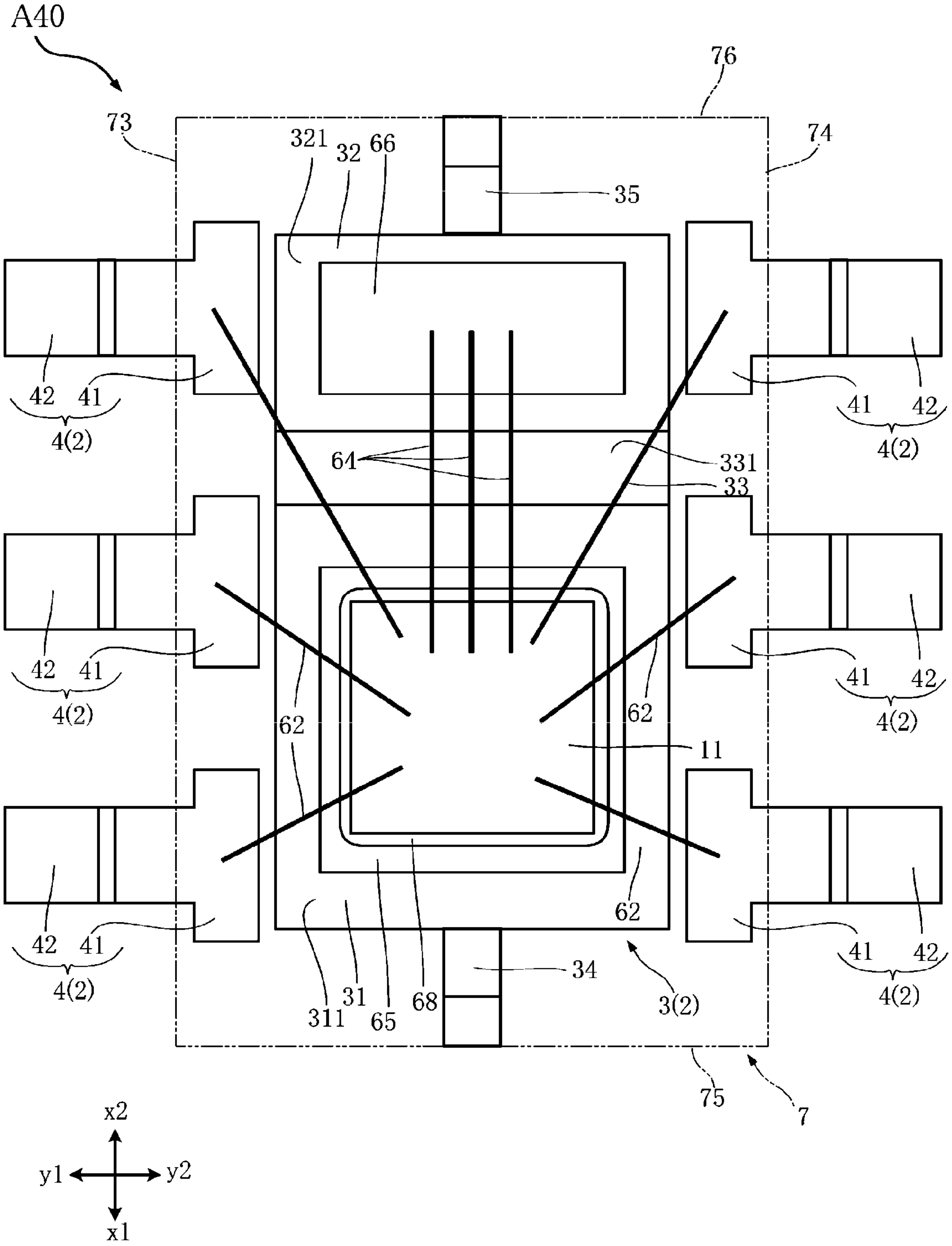
FIG. 21 is a plan view showing a semiconductor device according to a fourth embodiment of the present disclosure, wherein a sealing resin is transparent.

FIG. 21 is a view for explaining a semiconductor device A40 according to a fourth embodiment of the present disclosure. FIG. 21 is a plan view showing the semiconductor device A40 and is a view corresponding to FIG. 3. For the sake of convenience of understanding, in FIG. 21, the sealing resin 7 is transparent and the outer shape of the sealing resin 7 is indicated by an imaginary line (a two-dot chain line). The semiconductor device A40 of the present embodiment is different from the first embodiment in that the former does not include the second semiconductor element 12. The configurations and operations of other parts of the present embodiment are the same as those of the first embodiment. In addition, various parts of the first to third embodiments may be arbitrarily combined.

In the present embodiment, the semiconductor device A40 does not include the second semiconductor element 12, and only the first semiconductor element 11 is mounted on the semiconductor device A40. The first semiconductor element 11 is a HEMT. Further, the size of the second die pad 32 when viewed in the z direction is smaller than that of the second die pad 32 of the semiconductor device A10. The area of the main surface 321 of the second die pad 32 is half or less of the area of the main surface 311 of the first die pad 31. Further, the number of second leads 4 is six, which is smaller than that of the semiconductor device A10.

In the first semiconductor element 11 according to the present embodiment, a source electrode, a drain electrode, and a gate electrode, which are not shown, are arranged on the element main surface 111, and no electrode is arranged on the element back surface 112. The first semiconductor element 11 is mounted on the main surface 311 of the first die pad 31 via the bonding layer 68 which is an insulating bonding layer. The source electrode and the gate electrode of the first semiconductor element 11 are electrically connected to the second leads 4 via the wires 62. The drain electrode of the first semiconductor element 11 is electrically connected to the second die pad 32 via a plurality of wires 64. Each wire 64 is bonded to the drain electrode of the first semiconductor element 11, and to the metal layer 66 arranged on the main surface 321 of the second die pad 32. As a result, the second die pad 32 (the first lead 3) conducts to the drain electrode of the first semiconductor element 11 and functions as a drain terminal. Further, the number of wires 64 is not particularly limited.

Also in the present embodiment, the second die pad 32 is arranged at a position different from that of the first die pad 31 in the z direction. Therefore, even when an electronic component is mounted on the second die pad 32, the semiconductor device A40 can prevent the electronic component from being mounted in a state where the electronic component is in contact with the first semiconductor element 11. Further, the semiconductor device A40 can also prevent a bonding layer for bonding the electronic component and the bonding layer 68 from coming into contact with each other. Further, since the metal layer 66 is arranged on the main surface 321 of the second die pad 32, in the semiconductor device A40, even when a solder paste for bonding the electronic component to the metal layer 66 is melted during manufacturing, it is possible to prevent the solder paste from flowing through the main surface 331 of the connecting portion 33 beyond the boundary between the metal layer 66 and the main surface 321. Further, also in the present embodiment, since the back surface 312 of the first die pad 31 is exposed from the bottom surface 72 of the sealing resin 7, the semiconductor device A40 can appropriately dissipate the heat of the first semiconductor element 11.

Further, according to the present embodiment, each wire 64 is bonded to the main surface 321 of the second die pad 32 via the metal layer 66. The main surface 321 of the second die pad 32 is located on the z2 side in the z direction with respect to the main surface 311 of the first die pad 31. Further, since the first semiconductor element 11 is mounted on the main surface 311, a region for bonding the wires 64 is narrow. Therefore, as compared with a case where the wires 64 are bonded to the main surface 311, the semiconductor device A40 facilitates formation of the wires 64 and suppresses the occurrence of defects in the wires 64.

In the present embodiment, the case where the area of the main surface 321 of the second die pad 32 is half or less of the area of the main surface 311 of the first die pad 31 has been described, but the present disclosure is not limited thereto. When the area of the main surface 321 of the second die pad 32 is about the same as the area of the main surface 311 of the first die pad 31, the semiconductor device A40 and the semiconductor device A10 can share the first lead 3.

Fifth Embodiment

Figure 22:
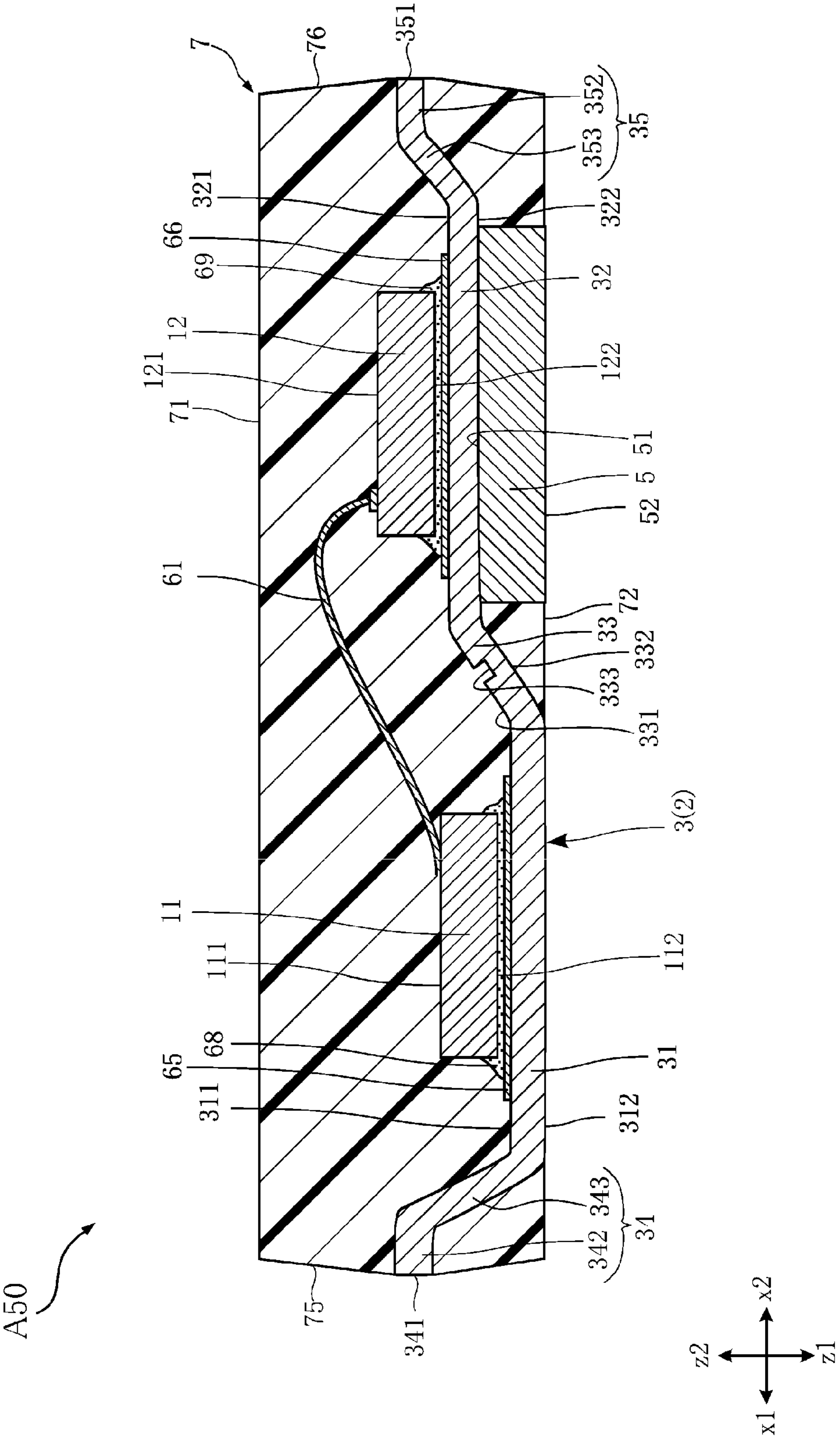
FIG. 22 is a cross-sectional view showing a semiconductor device according to a fifth embodiment of the present disclosure.

FIG. 22 is a view for explaining a semiconductor device A50 according to a fifth embodiment of the present disclosure. FIG. 22 is a cross-sectional view showing the semiconductor device A50 and is a view corresponding to FIG. 9. The semiconductor device A50 of the present embodiment is different from the first embodiment in that the former has combined features of the second and third embodiments. The configurations and operations of other parts of the present embodiment are the same as those of the first embodiment.

In the present embodiment, the connecting portion 33 includes the groove portion 333 as in the second embodiment. The configuration of the groove portion 333 is the same as that of the second embodiment. Various variations described in the second embodiment can be adopted as the groove portion 333. Further, instead of the groove portion 333, the connecting portion 33 may include the metal layer 334 as described in the first modification of the second embodiment, or may include the paste layer 335 as described in the second modification of the second embodiment.

Further, in the present embodiment, the semiconductor device A50 includes the heat transfer member 5 as in the third embodiment. The configuration of the heat transfer member 5 is the same as that of the third embodiment. Various variations described in the third embodiment can be adopted as the heat transfer member 5. Further, the heat transfer member 5 may be attached as described in the first modification of the third embodiment. The first semiconductor element 11 may be a switching element and the second semiconductor element 12 may be a drive element, as in the first embodiment, or the second semiconductor element 12 may be a switching element and the first semiconductor element 11 may be a drive element, as in the third embodiment.

According to the fifth embodiment, the effects described in the first to third embodiments can be achieved.

In the first to fifth embodiments, the case where the first semiconductor element 11 or the second semiconductor element 12 is mounted on the first die pad 31 and the second die pad 32 has been described, but the present disclosure is not limited thereto. Other electronic components (including semiconductor elements) may be further mounted on the first die pad 31 or the second die pad 32, or the first semiconductor element 11 or the second semiconductor element 12 may not be mounted on the first die pad 31 or the second die pad 32.

The semiconductor devices according to the present disclosure are not limited to the above-described embodiments. The specific configurations of various parts of the semiconductor devices according to the present disclosure can be freely changed in design.

[Supplementary Note 1]

A semiconductor device including:

a first lead (3);

a first semiconductor element (11) mounted on the first lead (3); and
a sealing resin (7) that covers the first semiconductor element (11),
wherein the first lead (3) includes:
a first die pad (31) having a first main surface (311) and a first back surface (312) facing opposite sides to each other in a thickness direction;
a second die pad (32) arranged side by side with the first die pad (31) in a first direction orthogonal to the thickness direction, and located on a side of the first main surface (311) with respect to the first die pad (31) in the thickness direction; and
a connecting portion (33) connected to the first die pad (31) and the second die pad (32), and
wherein the first back surface (312) is exposed from the sealing resin (7).

[Supplementary Note 2]

The semiconductor device of Supplementary Note 1, wherein the first semiconductor element (11) is mounted on the first main surface (311).

[Supplementary Note 3]

The semiconductor device of Supplementary Note 2, wherein the second die pad (32) has a second main surface (321) facing the same side as the first main surface (311) in the thickness direction, and a second back surface (322) facing the same side as the first back surface (312) in the thickness direction.

[Supplementary Note 4, Fourth Embodiment, FIG. 21]

The semiconductor device of Supplementary Note 3, further including a first connecting member (64) connected to the first semiconductor element (11) and the second main surface (321).

[Supplementary Note 5]

The semiconductor device of Supplementary Note 3 or 4, further including a second semiconductor element (12) mounted on the second main surface (321).

[Supplementary Note 6]

The semiconductor device of Supplementary Note 5, further including a second connecting member (61) connected to the first semiconductor element (11) and the second semiconductor element (12).

[Supplementary Note 7]

The semiconductor device of Supplementary Note 5 or 6, further including a bonding layer (69) interposed between the second main surface (321) and the second semiconductor element (12).

[Supplementary Note 8]

The semiconductor device of Supplementary Note 7, wherein the bonding layer (69) is solder.

[Supplementary Note 9]

The semiconductor device of any one of Supplementary Notes 5 to 8, wherein the first semiconductor element (11) is a switching element, and the second semiconductor element (12) is a drive element that drives the first semiconductor element (11).

[Supplementary Note 10]

The semiconductor device of any one of Supplementary Notes 3 to 9, further including a metal layer (66) arranged on the second main surface (321).

[Supplementary Note 11]

The semiconductor device of Supplementary Note 10, wherein the metal layer (66) contains Ag.

[Supplementary Note 12]

The semiconductor device of Supplementary Note 10 or 11, wherein the metal layer (66) is contained in the second main surface (321) when viewed in the thickness direction.

[Supplementary Note 13]

The semiconductor device of any one of Supplementary Notes 3 to 12, wherein an area of the first main surface (311) is substantially the same as an area of the second main surface (321).

[Supplementary Note 14, Fourth Embodiment, FIG. 21]

The semiconductor device of any one of Supplementary Notes 3 to 12, wherein an area of the second main surface (321) is half or less of an area of the first main surface (311).

[Supplementary Note 15]

The semiconductor device of any one of Supplementary Notes 1 to 14, further including a plurality of second leads (4), each of which has a terminal portion (42) that protrudes from the sealing resin (7), wherein the terminal portion (42) is arranged along the first direction.

According to the present disclosure in some embodiments, it is possible to prevent an electronic component mounted on a first die pad of a first lead from coming into contact with an electronic component mounted on a second die pad.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
a first lead;
a first semiconductor element mounted on the first lead; and
a sealing resin that covers the first semiconductor element,
wherein the first lead comprises:
a first die pad having a first main surface and a first back surface facing opposite sides to each other in a thickness direction;
a second die pad arranged side by side with the first die pad in a first direction orthogonal to the thickness direction, and located on a side of the first main surface with respect to the first die pad in the thickness direction, the second die pad having a main surface facing the same side as the first main surface in the thickness direction; and
a connecting portion connected to the first die pad and the second die pad, the connecting portion having a third main surface connected to the first main surface and the second main surface,
wherein the first back surface is exposed from the sealing resin,
wherein the second die pad has a second back surface facing a same side as the first back surface in the thickness direction,
wherein the second back surface is arranged at a position different from the first back surface in the thickness direction, and
wherein the connecting portion includes at least one selected from the group of a groove portion and a protrusion portion formed at the third main surface and configured to inhibit a flow of a fluid on the third main surface.

2. The semiconductor device of claim 1, wherein the first semiconductor element is mounted on the first main surface.

3. The semiconductor device of claim 1, further comprising a first connecting member connected to the first semiconductor element and the second main surface.

4. The semiconductor device of claim 1, further comprising a second semiconductor element mounted on the second main surface.

5. The semiconductor device of claim 4, further comprising a second connecting member connected to the first semiconductor element and the second semiconductor element.

6. The semiconductor device of claim 4, further comprising a bonding layer interposed between the second main surface and the second semiconductor element.

7. The semiconductor device of claim 6, wherein the bonding layer is solder.

8. The semiconductor device of claim 4, wherein the first semiconductor element is a switching element, and the second semiconductor element is a drive element that drives the first semiconductor element.

9. The semiconductor device of claim 1, further comprising a metal layer arranged on the second main surface.

10. The semiconductor device of claim 9, wherein the metal layer contains Ag.

11. The semiconductor device of claim 9, wherein the metal layer is contained in the second main surface when viewed in the thickness direction.

12. The semiconductor device of claim 1, wherein an area of the first main surface is substantially the same as an area of the second main surface.

13. The semiconductor device of claim 1, wherein an area of the second main surface is half or less of an area of the first main surface.

14. The semiconductor device of claim 1, further comprising:

a plurality of second leads, each of which has a terminal portion that protrudes from the sealing resin, wherein the terminal portion is arranged along the first direction.

* * * * *